(12) United States Patent  (10) Patent No.: US 9,817,788 B2
Ho et al.  (45) Date of Patent: Nov. 14, 2017

(54) HUB DEVICES AND METHODS FOR INITIALIZING HUB DEVICE

(71) Applicant: VIA TECHNOLOGIES, INC., New Taipei (TW)

(72) Inventors: Chih-Long Ho, New Taipei (TW); Yi-Te Chen, New Taipei (TW); Wen-Hao Cheng, New Taipei (TW); Kuo-Yu Wu, New Taipei (TW); Chun-Heng Lin, New Taipei (TW); Po-Ming Huang, New Taipei (TW)

(73) Assignee: VIA TECHNOLOGIES, INC., New Taipei (TW)

(*) Notice: Subject to any disclaimer, the term of this patent is extended or adjusted under 35 U.S.C. 154(b) by 0 days.

(21) Appl. No.: 15/167,668

(22) Filed: May 27, 2016

(65) Prior Publication Data

US 2016/0275040 A1  Sep. 22, 2016

Related U.S. Application Data

(63) Continuation of application No. 13/939,691, filed on Jul. 11, 2013.

(30) Foreign Application Priority Data

Jun. 6, 2013 (TW) .............................. 102120062 A

(51) Int. Cl.
  *G06F 13/32* (2006.01)
  *G06F 13/42* (2006.01)
  (Continued)

(52) U.S. Cl.
  CPC ...... *G06F 13/4282* (2013.01); *G06F 13/4027* (2013.01); *G06F 13/4063* (2013.01);
  (Continued)

(58) Field of Classification Search
  None
  See application file for complete search history.

(56) References Cited

U.S. PATENT DOCUMENTS 5,448,496 A    9/1995  Butts et al.
5,493,239 A *  2/1996  Zlotnick ............. G06F 17/5054
                                                                326/38
(Continued)

FOREIGN PATENT DOCUMENTS

CN    1425968    6/2003
CN    1627412    6/2005
(Continued)

OTHER PUBLICATIONS www.wikipedia.com, Static Random-Access Memory, Feb. 2011, pp. 1-5.*

*Primary Examiner* — Henry Tsai
*Assistant Examiner* — Dean Phan
(74) *Attorney, Agent, or Firm* — McClure, Qualey & Rodack, LLP

(57) ABSTRACT

A hub device and corresponding method include a first chip having at least a first upstream port and a plurality of first downstream ports, a second chip, having at least a second upstream port and at least one second downstream port; and an external memory device, storing firmware data corresponding to the first chip and the second chip. One one of the first downstream ports of the first chip is coupled to the second upstream port of the second chip to form a tiered hub, and the first chip and the second chip are sequentially enabled and the first chip and the second chip sequentially load the corresponding firmware data.

13 Claims, 18 Drawing Sheets

Related U.S. Application Data

(60) Provisional application No. 61/699,442, filed on Sep. 11, 2012, provisional application No. 61/671,369, filed on Jul. 13, 2012.

(51) Int. Cl.
  *G06F 13/40* (2006.01)
  *G11C 7/10* (2006.01)
  *G06F 3/00* (2006.01)

(52) U.S. Cl.
  CPC .... *G11C 7/1072* (2013.01); *G06F 2213/0016* (2013.01); *G06F 2213/4004* (2013.01)

(56) References Cited

U.S. PATENT DOCUMENTS

| | | | |
|---|---|---|---|
| 5,640,106 A | 6/1997 | Erickson | |
| 5,773,993 A * | 6/1998 | Trimberger | H03K 19/17764 326/38 |
| 5,970,220 A | 10/1999 | Bolash et al. | |
| 7,265,578 B1 * | 9/2007 | Tang | G01B 31/318516 326/40 |
| 7,278,036 B2 | 10/2007 | Yuan | |
| 8,058,897 B1 * | 11/2011 | Lu | G06F 17/5054 326/101 |
| 2005/0273180 A1 | 12/2005 | Tung et al. | |
| 2008/0120454 A1 | 5/2008 | Chang et al. | |
| 2009/0125606 A1 * | 5/2009 | Kamei | G06F 8/65 709/217 |

FOREIGN PATENT DOCUMENTS

| | | |
|---|---|---|
| CN | 1731336 | 2/2006 |
| CN | 101206628 | 6/2008 |
| EP | 0 959 438 | 11/1999 |
| TW | 200620839 | 6/2006 |
| TW | 200823669 | 6/2008 |

\* cited by examiner

HUB DEVICES AND METHODS FOR INITIALIZING HUB DEVICE

CROSS REFERENCE TO RELATED APPLICATIONS

This application is a Continuation of pending U.S. patent application Ser. No. 13/939,691, filed on Jul. 11, 2013, which claims the benefit of U.S. Provisional Application No. 61/671,369 filed 2012 Jul. 13, U.S. Provisional Application No. 61/699,442 filed 2012 Sep. 11, and Taiwan Patent Application No. 102120062, filed on Jun. 6, 2013. The entire contents of which are hereby incorporated by reference.

BACKGROUND OF THE INVENTION

Field of the Invention

The invention relates to a hub device, and more particularly to a hub device with extended port number and reduced manufacturing costs.

Description of the Related Art

Recently, more and more portable electronic devices are becoming more and more advanced, such as cellular phones, tablet computers, MP3 players, portable hard disks, global positioning systems (GPS), digital cameras, portable gaming devices, or others. Although the portable electronic devices are easy to be carried, once data transmission or system data update is required, the portable electronic devices still have to connect to a host device. However, the number of ports of a host device is usually limited. When multiple portable electronic devices have to connect to a host device at the same time, a hub device is required to extend the number of ports of the host device.

Therefore, how to improve upon the extended number of ports and the efficiency of a hub device are issues of concern.

BRIEF SUMMARY OF THE INVENTION

Hub devices and methods for initializing a hub device are provided. An exemplary embodiment of a hub device comprises a first chip, a second chip and an external memory device. The first chip comprises at least a first upstream port and a plurality of first downstream ports. The second chip comprises at least a second upstream port and a plurality of second downstream ports. An external memory device stores firmware data corresponding to the first chip and the second chip. One of the first downstream ports of the first chip is coupled to the second upstream port of the second chip to form a tiered hub, wherein the first chip and the second chip are sequentially enabled and the first chip and the second chip sequentially load the corresponding firmware data.

An exemplary embodiment of a method for initializing a hub device, wherein the hub device comprises at least a first chip and a second chip, and an external memory device. The external memory device is shared by the first chip and the second chip and stores firmware data of the first chip and the second chip. The method comprises: generating a first start-up signal to enable the first chip; reading the firmware data corresponding to the first chip from the external memory device by the first chip; generating a second start-up signal to enable the second chip; and reading the firmware data corresponding to the second chip from the external memory device by the second chip.

Another exemplary embodiment of a method for initializing a hub device, wherein the hub device comprises at least a first chip and a second chip, and an external memory device. The external memory device is shared by the first chip and the second chip and stores firmware data of the first chip and the second chip, comprises: generating a first start-up signal to enable the first chip; reading the firmware data corresponding to the first chip and the second chip from the external memory device by the first chip; generating a second start-up signal to enable the second chip; and receiving the firmware data corresponding to the second chip from the first chip by the second chip.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

A novel hub device structure, which can simply achieve port extension based on the existing hub devices, is provided. The cost of manufacturing the hub device can be greatly reduced by the ability to share an external memory device therewith. In addition, in some embodiments of the invention, the cost of manufacturing the hub device can be further reduced by the ability to share a crystal oscillator.

According to an embodiment of the invention, the hub device comprises a plurality of chips and an external memory device shared by the chips. Each chip may be a hub device chip and may comprise at least one upstream port and a plurality of downstream ports for providing hub function. In other words, each chip can be solely implemented as the hub chip of a hub device. However, in the embodiment of the invention, a downstream port of at least one chip is coupled to an upstream port of one or more chips to form a tiered hub. In this manner, port extension can be achieved based on the existing hub chips. In addition, in the embodiments of the invention, there is no need to configure a dedicated external memory device for each chip. In other words, only one external memory device has to be configured in the hub device and shared by the chips. Therefore, the cost of manufacturing the hub device can be further reduced. The proposed hub devices are further introduced in the following paragraphs.

Figure 1:
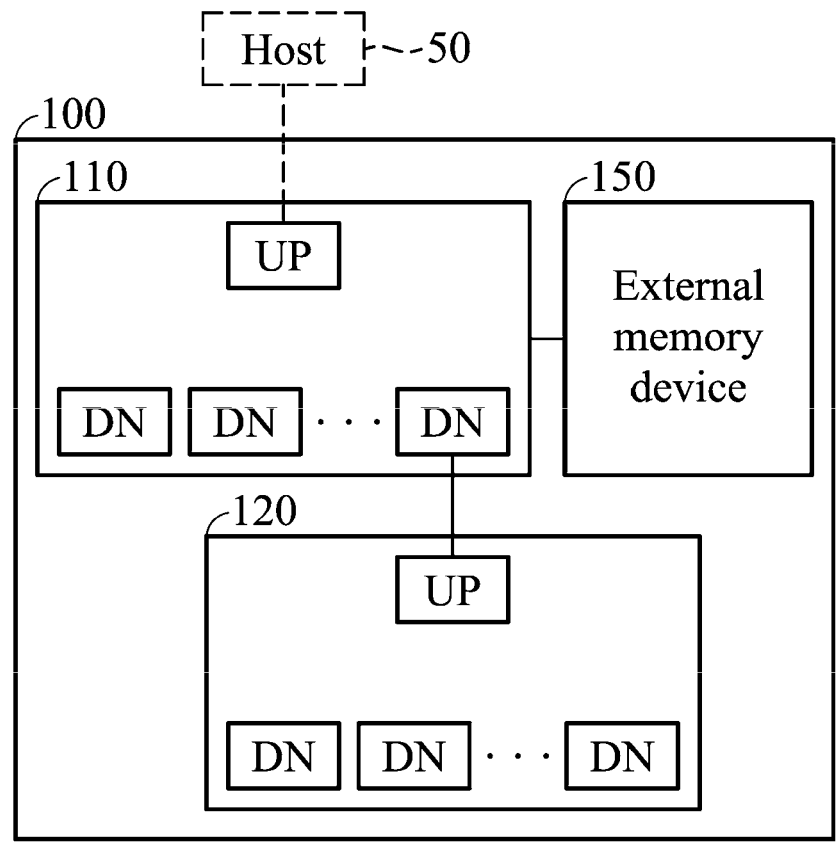
FIG. 1 shows a schematic block diagram of a hub device according to an embodiment of the invention.

FIG. 1 shows a schematic block diagram of a hub device according to an embodiment of the invention. The hub device 100 may comprise at least chips 110 and 120 and an external memory device 150 disposed outside of the chips 110 and 120. The chips 110 and 120 may respectively comprise at least one upstream port UP and a plurality of downstream ports DN. The upstream port UP of the chip 110 may be coupled to a host 50 and one of the downstream ports DN of the chip 110 may be coupled to the upstream port UP of the chip 120 to form a tiered hub. In this embodiment, the chip 110 may be regarded as a first tier chip or the top tier chip of the hub device 100, and the chip 120 may be regarded as a second tier chip or a bottom tier chip of the hub device 100.

Figure 2:
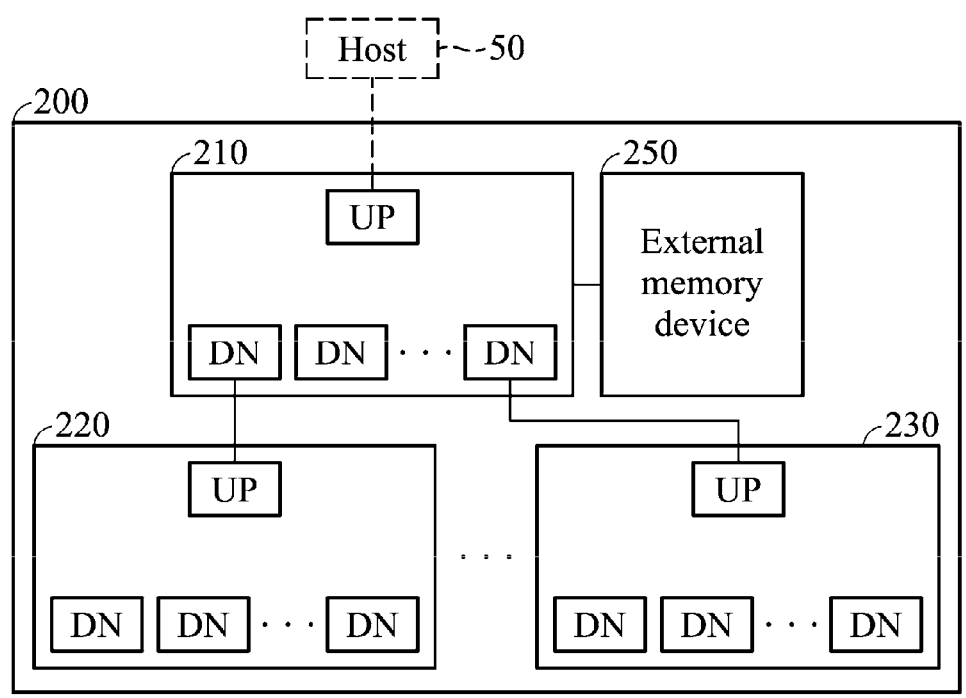
FIG. 2 shows a schematic block diagram of a hub device according to another embodiment of the invention.

FIG. 2 shows a schematic block diagram of a hub device according to another embodiment of the invention. The hub device 200 may comprise at least chips 210, 220 and 230 and an external memory device 250 disposed outside of the chips 210, 220 and 230. The chips 210, 220 and 230 may respectively comprise at least one upstream port UP and a plurality of downstream ports DN. The upstream port UP of the chip 210 may be coupled to a host 50 and two of the downstream ports DN of the chip 210 may be respectively coupled to the upstream port UP of the chip 220 and the upstream port UP of the chip 230 to form a tiered hub. In this embodiment, the chip 210 may be regarded as a first tier chip or the top tier chip of the hub device 200, and the chips 220 and 230 may be regarded as a second tier chips or bottom tier chips of the hub device 200.

Figure 3:
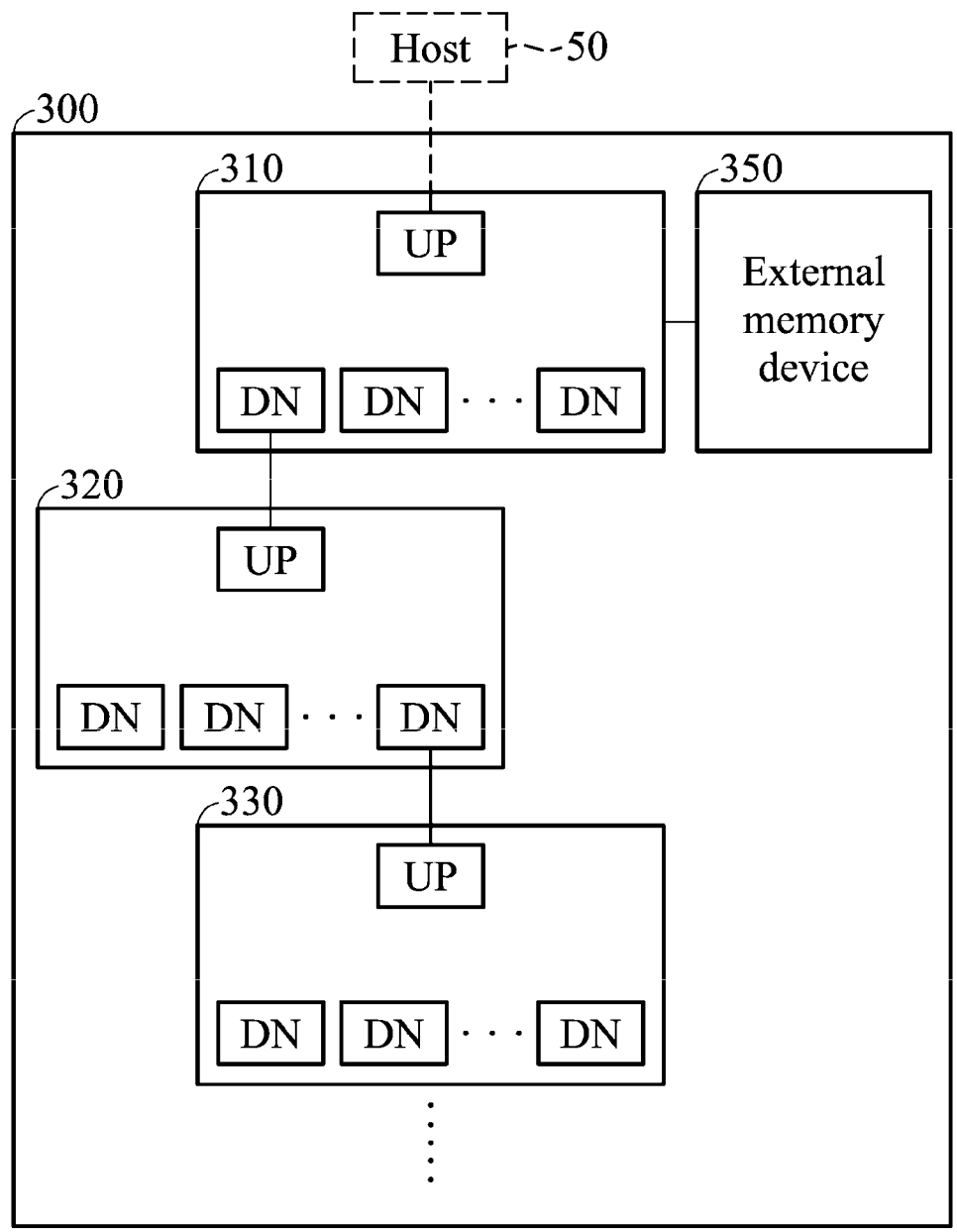
FIG. 3 shows a schematic block diagram of a hub device according to yet another embodiment of the invention.

FIG. 3 shows a schematic block diagram of a hub device according to yet another embodiment of the invention. The hub device 300 may comprise at least chips 310, 320 and 330 and an external memory device 350 disposed outside of the chips 310, 320 and 330. The chips 310, 320 and 330 may respectively comprise at least one upstream port UP and a plurality of downstream ports DN. The upstream port UP of the chip 310 may be coupled to a host 50, one of the downstream ports DN of the chip 310 may be coupled to the upstream port UP of the chip 320, and one of the downstream ports DN of the chip 320 may be coupled to the upstream port UP of the chip 330 to form a tiered hub. In this embodiment, the chip 310 may be regarded as a first tier chip or the top tier chip of the hub device 300, and the chip 320 may be regarded as a second tier chip of the hub device 300, and the chip 330 may be regarded as a third tier chip or a bottom tier chip of the hub device 300.

Note that FIG. 1 to FIG. 3 merely show three of several possible designs of a tiered hub, and the invention should not be limited to the structure as shown in FIG. 1 to FIG. 3. Those who are skilled in this technology can make various alterations and modifications based on the concept as illustrated above to derive other non-discussed structures. Therefore, the scope of the present invention shall be defined and protected by the following claims and their equivalents. In addition, note that, in order to clarify the concept of the invention, FIG. 1-3 presents a simplified block diagram, in which only the elements relevant to the invention are shown. However, those who are skilled in this technology can easily derive other elements and thus the invention should not be limited what is shown in FIG. 1-3.

As discussed above, in the embodiment of the invention, since only one external memory device is configured in the hub device and is shared by the chips, the cost of manufacturing the hub device may be reduced. According to an embodiment of the invention, the shared external memory device may store firmware data corresponding to each chip. The firmware data may comprise firmware or software programs and the data required by each chip for operating, such as relative parameters or look up tables. When each chip is enabled, the corresponding firmware data is loaded to finish initialization procedure of each chip. After initialization, each chip may begin operation by executing the corresponding firmware or software programs. Several embodiments of sharing the external memory device are further illustrated in the following paragraphs.

Figure 4:
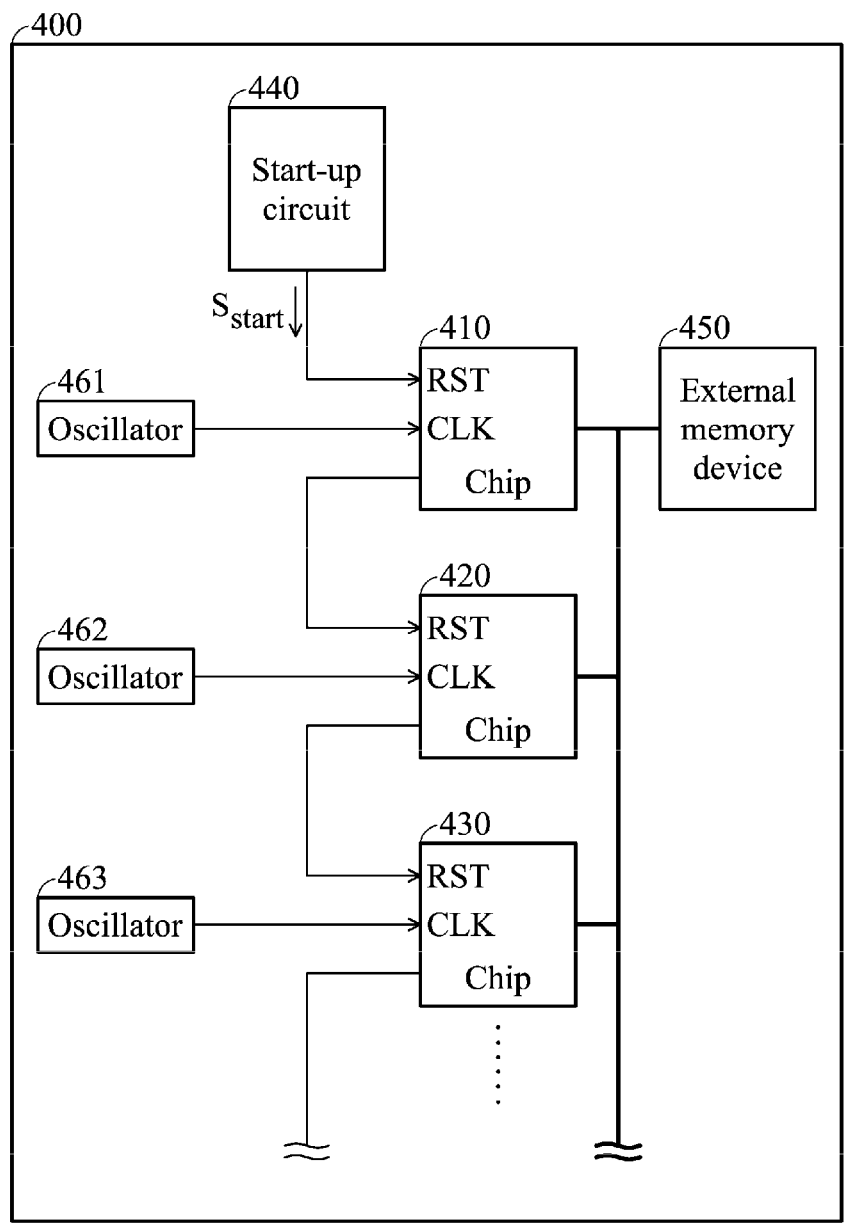
FIG. 4 shows a schematic block diagram of a hub device according to still another embodiment of the invention.

FIG. 4 shows a schematic block diagram of a hub device according to still another embodiment of the invention. The hub device 400 may comprise chips 410, 420 and 430, a start-up circuit 440, oscillators 461, 462 and 463, and an external memory device 450 disposed outside of the chips 410, 420 and 430. According to an embodiment of the invention, the chips 410, 420 and 430 may be sequentially enabled and may sequentially load the corresponding firmware data to finish the initialization procedure.

The start-up circuit 440 may generate a start-up signal $S_{Start}$ and transmit the start-up signal $S_{Start}$ to a reset signal input terminal RST to enable/reset the chip 410. For example, when the hub device 400 is powered by an electric power source, the start-up circuit 440 may generate the start-up signal $S_{Start}$ based on the received electric power.

The oscillators 461, 462 and 463 may respectively generate a clock signal and provide the corresponding clock signal to a clock signal input terminal CLK of the chips 410, 420 and 430. The chips 410, 420 and 430 may execute super high speed data transmission (for example, USB 3.0) or non-super high speed data transmission (for example, USB 2.0 or USB 1.0) based on the corresponding clock signal.

In the embodiment, the chip 410 is a first tier chip or the top tier chip of the hub device 400. When the chip 410 receives the start-up signal $S_{Start}$, the chip 410 is enabled or reset. Next, the chip 410 may obtain control right of accessing the external memory device 450 so as to read the corresponding firmware data from the external memory device 450. In an embodiment of the invention, the chip 410 may store the corresponding firmware data in an internal memory device (not shown) of the chip 410 to finish the initialization procedure. When the initialization procedure is finished, the chip 410 may further generate a start-up signal and transmit the start-up signal to a reset signal input terminal RST of the chip 420 to enable/reset the chip 420. Note that after obtaining the required firmware data from the external memory device 450, the chip 410 may release the control right of accessing the external memory device 450. Thereby, the other chips (for example, the chip 420 or 430) may obtain the control right of accessing the external memory device 450 after being enabled or reset, so as to read the required firmware data and achieve the goal of sharing the external memory device 450 among the chips 410, 420 and 430. In the embodiment, the chip 420 is a tier of the chips, other than the first tier chip, of the hub device 400.

Similarly, when the chip 420 receives a start-up signal, the chip 420 is enabled or reset. Next, the chip 420 acquires the control right of accessing the external memory device 450 so as to read the corresponding firmware data from the external memory device 450. In an embodiment of the invention, the chip 420 may store the corresponding firmware data in the internal memory device (not shown) of the chip 420 to finish the initial procedure. As discussed above, after obtaining the required firmware data from the external memory device 450, the chip 420 may release the control right of accessing the external memory device 450. Next, the chip 420 may further generate a start-up signal and transmit the start-up signal to a reset signal input terminal RST of the chip 430 to enable/reset the chip 430. In the embodiment, the chip 430 is a tier of the chip, other than the first tier chip, of the hub device 400.

Similarly, when the chip 430 receives the start-up signal, the chip 430 may be enabled or reset. Next, the chip 430 reads the corresponding firmware data from the external memory device 450. In an embodiment of the invention, the chip 430 may store the received firmware data in the internal memory device (not shown) of the chip 430 to finish the initialization procedure.

In an embodiment of the invention, the external memory device 450 may be coupled to the chips 410, 420 and 430 via a Serial Peripheral Interface (SPI) bus or an Inter-Integrated Circuit (I2C) bus. Take the SPI bus for example, the chip 410, 420 or 430 may apply different voltage levels at the pin SPI_CS# of the SPI bus to obtain or release the control right of accessing the external memory device 450. In the embodiment, the chip 410 may be a main control chip of the hub device 400 and the firmware data corresponding to the chips 410, 420 and 430 may be the same or different. Therefore, during the initialization procedure, the chips 410, 420 and 430 may sequentially access the same or different memory block of the external memory device 450. However, the external memory device 450 (for example, EEPROM with SPI interface) usually cannot be accessed by multiple chips at the same time. Therefore, in the embodiment of the invention, by sequentially generating the start-up signal, the access of the external memory device 450 may be well controlled, such that one chip may access the shared external memory device 450 only when another chip has finished accessing the external memory device 450. Therefore, collision (that is, two or more chips accessing the shared external memory device 450 at the same time) can be prevented.

Figure 5:
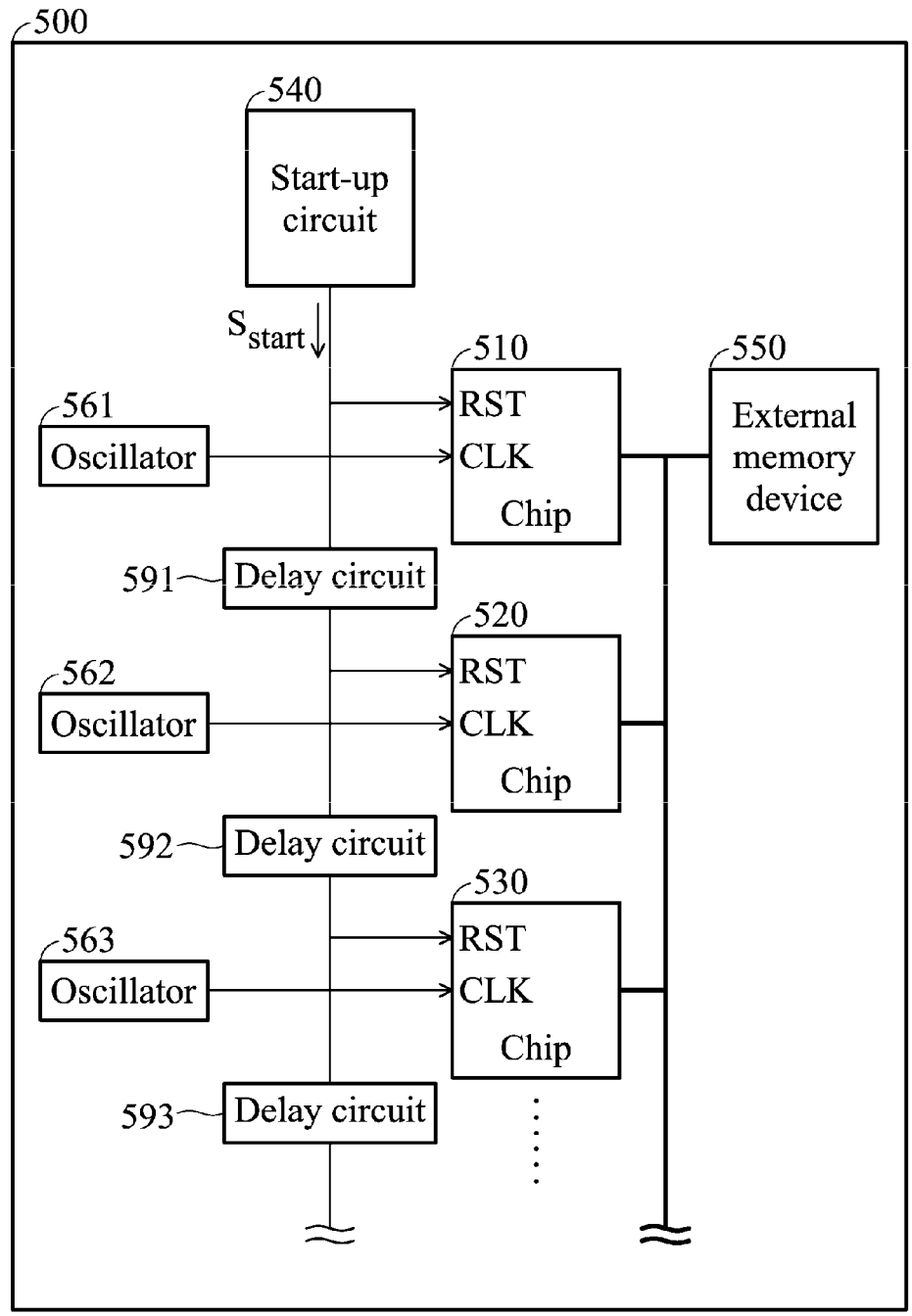
FIG. 5 shows a schematic block diagram of a hub device according to still another embodiment of the invention.

FIG. 5 shows a schematic block diagram of a hub device according to still another embodiment of the invention. The hub device 500 may at least comprise chips 510, 520 and 530, a start-up circuit 540, oscillators 561, 562 and 563, delay circuits 591, 592 and 593 and an external memory device 550 disposed outside of the chips 510, 520 and 530. According to an embodiment of the invention, the chips 510, 520 and 530 may be sequentially enabled and may sequentially load corresponding firmware data to finish the initialization procedure.

Note that most of the elements in FIG. 5 are the same as FIG. 4. The main difference therebetween is that the start-up signals received by the remaining chips other than the first tier chip in the hub device 500 are generated based on the start-up signal $S_{Start}$ through the delay circuits 591, 592 and 593 in FIG. 5. Therefore, for the descriptions of like elements, reference may be made to FIG. 4, and are omitted here for brevity. The start-up circuit 540 may generate the start-up signal $S_{Start}$ and transmit the start-up signal $S_{Start}$ to the chip 510 to enable/reset the chip 510. Meanwhile, the start-up signal $S_{Start}$ generated by the start-up circuit 540 may further be transmitted to the delay circuit 591. The delay circuit 591 may delay the start-up signal $S_{Start}$ and may generate another start-up signal to the chip 520 and the delay circuit 592 after a predetermined time interval. According to an embodiment of the invention, the delay circuit 591 may wait or delay the start-up signal $S_{Start}$ for the predetermined time interval as discussed above, and then transmit the start-up signal to the chip 520 and the delay circuit 592. Similarly, the delay circuit 592 may wait or delay the start-up signal $S_{Start}$ for the predetermined time interval as discussed above, and then transmit the start-up signal to the chip 530 and the delay circuit 593. In the embodiment of the invention, the predetermined time interval may be longer than the time interval required by each chip to read the corresponding firmware data. In another embodiment of the invention, the predetermined time interval may be longer than the time interval required by each chip to read the corresponding firmware data and finish initialization procedure. Thereby, simultaneous access of the external memory device 550 by different chips at the same time may be prevented. Note that in other embodiments of the invention, the start-up signal received by each chip of the hub device may also be generated through different start-up circuits, as long as the timing of the start-up signal received by each chip can be well-controlled, such that simultaneous access of the external memory device 550 by different chips can be prevented.

Figure 6:
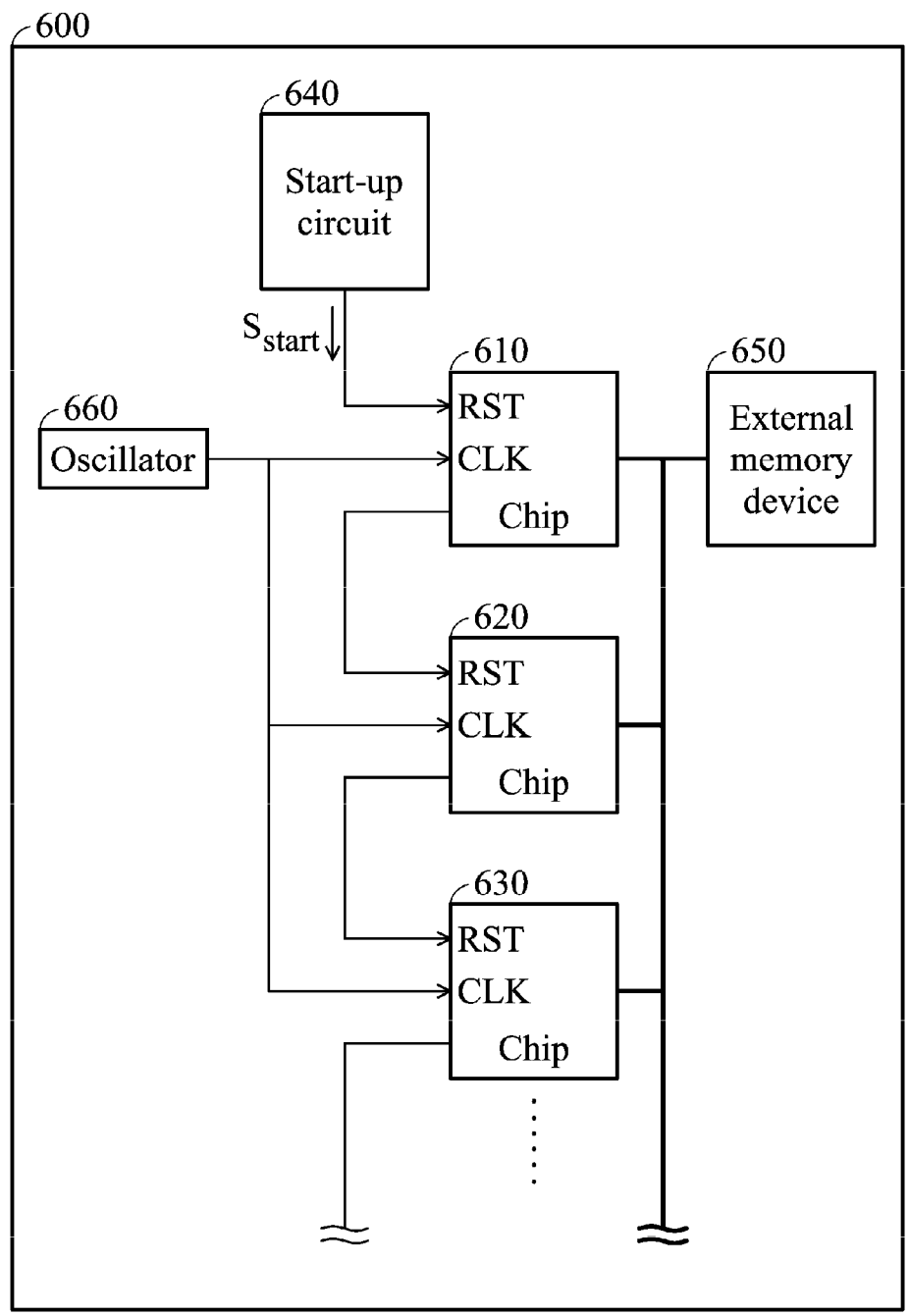
FIG. 6 shows a schematic block diagram of a hub device according to still another embodiment of the invention.

FIG. 6 shows a schematic block diagram of a hub device according to still another embodiment of the invention. The hub device 600 may at least comprise chips 610, 620 and 630, a start-up circuit 640, an oscillator 660 and an external memory device 650 disposed outside of the chips 610, 620 and 630. According to an embodiment of the invention, the chips 610, 620 and 630 may be sequentially enabled and may sequentially load the corresponding firmware data to finish the initialization procedure.

Most of the elements in FIG. 6 are the same as FIG. 4. The main difference therebetween is that the chips 610, 620 and 630 share the clock signal generated by the same oscillator 660 in FIG. 6. Therefore, for descriptions of like elements, reference may be made to FIG. 4, and are omitted here for brevity.

Figure 7:
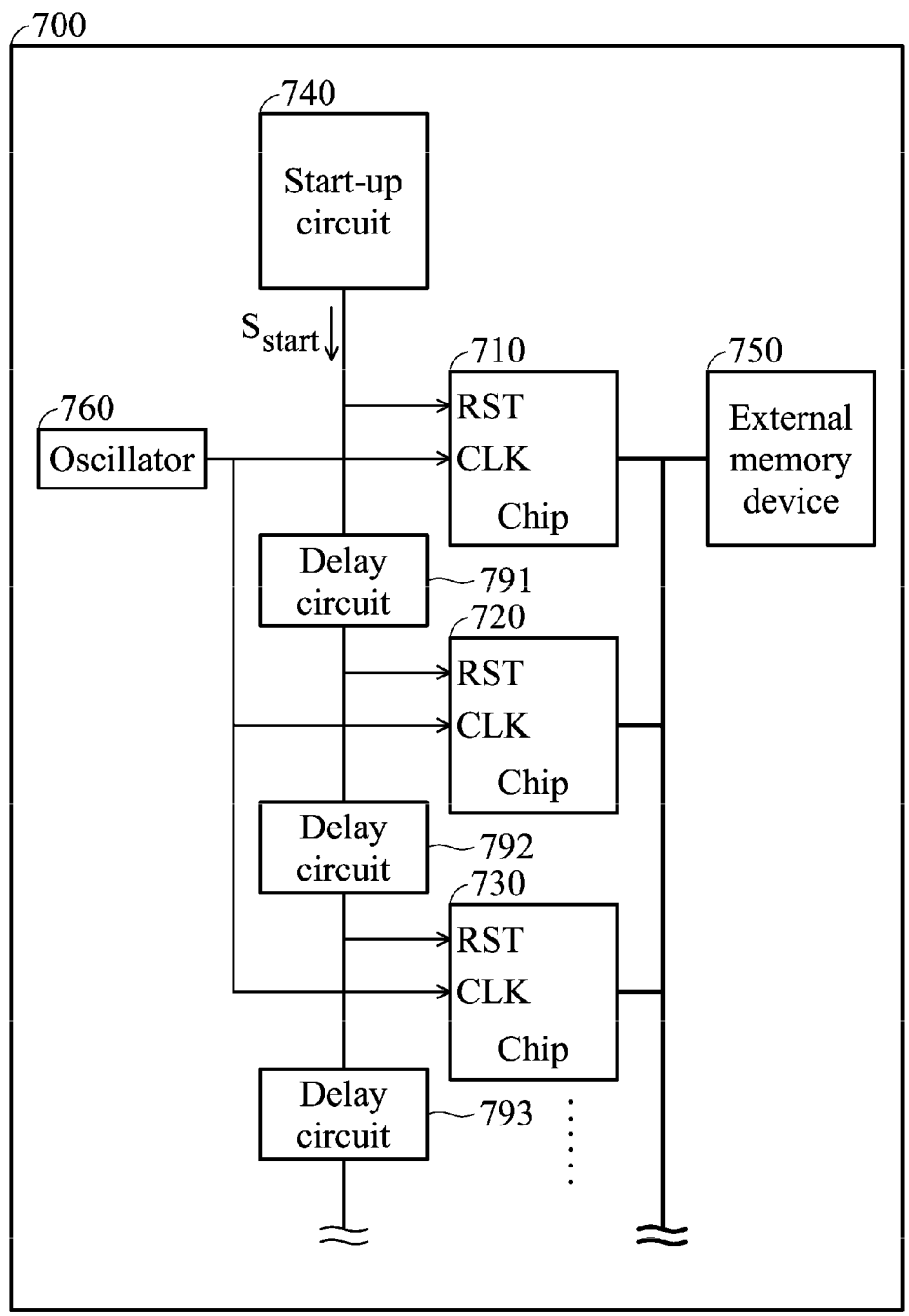
FIG. 7 shows a schematic block diagram of a hub device according to still another embodiment of the invention.

FIG. 7 shows a schematic block diagram of a hub device according to still another embodiment of the invention. The hub device 700 may at least comprise chips 710, 720 and 730, a start-up circuit 740, an oscillator 760, delay circuits 791, 792 and 793 and an external memory device 750 disposed outside of the chips 710, 720 and 730. According to an embodiment of the invention, the chips 710, 720 and 730 may be sequentially enabled and may sequentially load the corresponding firmware data to finish the initialization procedure.

Most of the elements in FIG. 7 are the same as FIG. 5. The main difference therebetween is that the chips 710, 720 and 730 share the clock signal generated by the same oscillator 760 in FIG. 7. Therefore, for descriptions of like elements, reference may be made to FIG. 4 and FIG. 5, and are omitted here for brevity.

Figure 8:
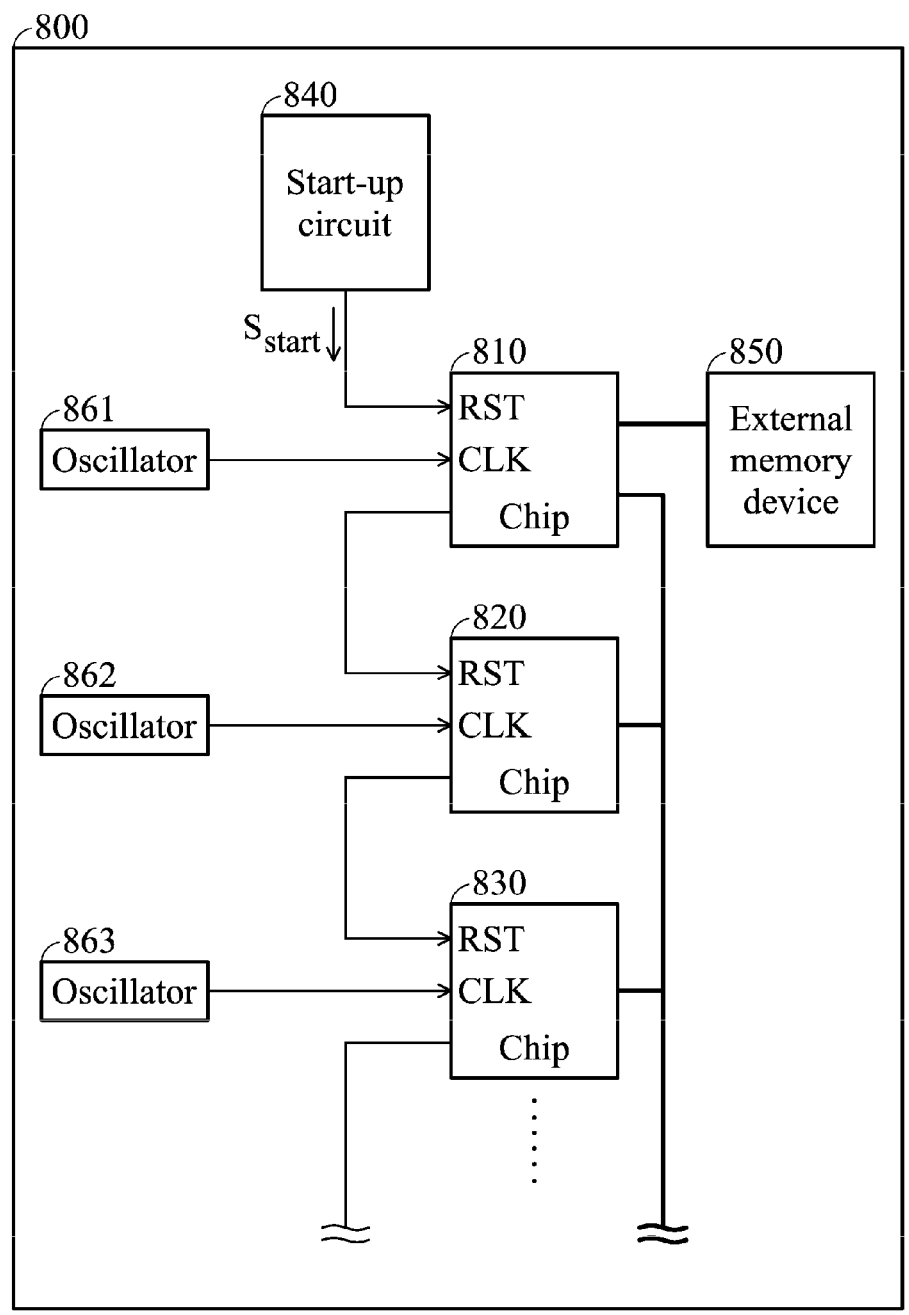
FIG. 8 shows a schematic block diagram of a hub device according to still another embodiment of the invention.

FIG. 8 shows a schematic block diagram of a hub device according to still another embodiment of the invention. The hub device 800 may at least comprise chips 810, 820 and 830, a start-up circuit 840, oscillators 861, 862 and 863, and an external memory device 850 disposed outside of the chips 810, 820 and 830. According to an embodiment of the invention, the chips 810, 820 and 830 may be sequentially enabled and may sequentially load the corresponding firmware data to finish the initialization procedure.

Most of the elements in FIG. 8 are the same as FIG. 4. The main difference therebetween is that the first tier chip 810 is coupled to the external memory device 850 for reading the corresponding firmware data of the chips 810, 820 and 830 from the external memory device 850 and storing the firmware data in the internal memory device (not shown) of the chip 810 in FIG. 8. When the chips 820 and 830 are sequentially enabled, the chips 820 and 830 further receive the corresponding firmware data from the chip 810. In the embodiment of the invention, the chips 820 and 830 receive the firmware data from chip 810 instead of direct accessing the firmware data stored in the external memory device 850. In other words, only the top tier chip (for example, chip 810) is directly connected to the external memory device 850 and the other tiers of chips (for example, the chips 820 and 830) are not directly connected to the external memory device 850. The chips in the lower tiers may receive the firmware data from the chip in the upper tier to finish the initialization procedure.

The chips 810, 820 and 830 are mutually connected through a transmission bus disposed therebetween, such as Serial Peripheral Interface (SPI) bus, a System Management (SM) bus, an Inter-Integrated Circuit (I2C) bus, or others.

Note that in other embodiments of the invention, the chip 810 may also not store the firmware data corresponding to the chips 820 and 830 in the internal memory device, but directly read the firmware data corresponding to the chips 820 and 830 from the external memory device 850 and transmit the corresponding firmware data to the chips 820 and 830, respectively, during the initialization procedure of the chips 820 and 830.

As discussed above, the firmware data corresponding to the chips 810, 820 and 830 may be the same or different data. In addition, note that in the other embodiments of the invention, the chip 830 may also receive the corresponding firmware data from the chip 820 instead of from the chip 810. For example, when receiving the corresponding firmware data, the chip 820 may receive the firmware data corresponding to the chip 830 at the same time. In addition, the chip 810 (or in some embodiments, the chip 820) may actively or passively (for example, in response to a request signal) transmit the firmware data of the chips 820 and 830 (or in some embodiments, the chip 830).

The descriptions of the remaining elements in FIG. 8 may refer to the illustrations of FIG. 4, and are omitted here for brevity.

Figure 9:
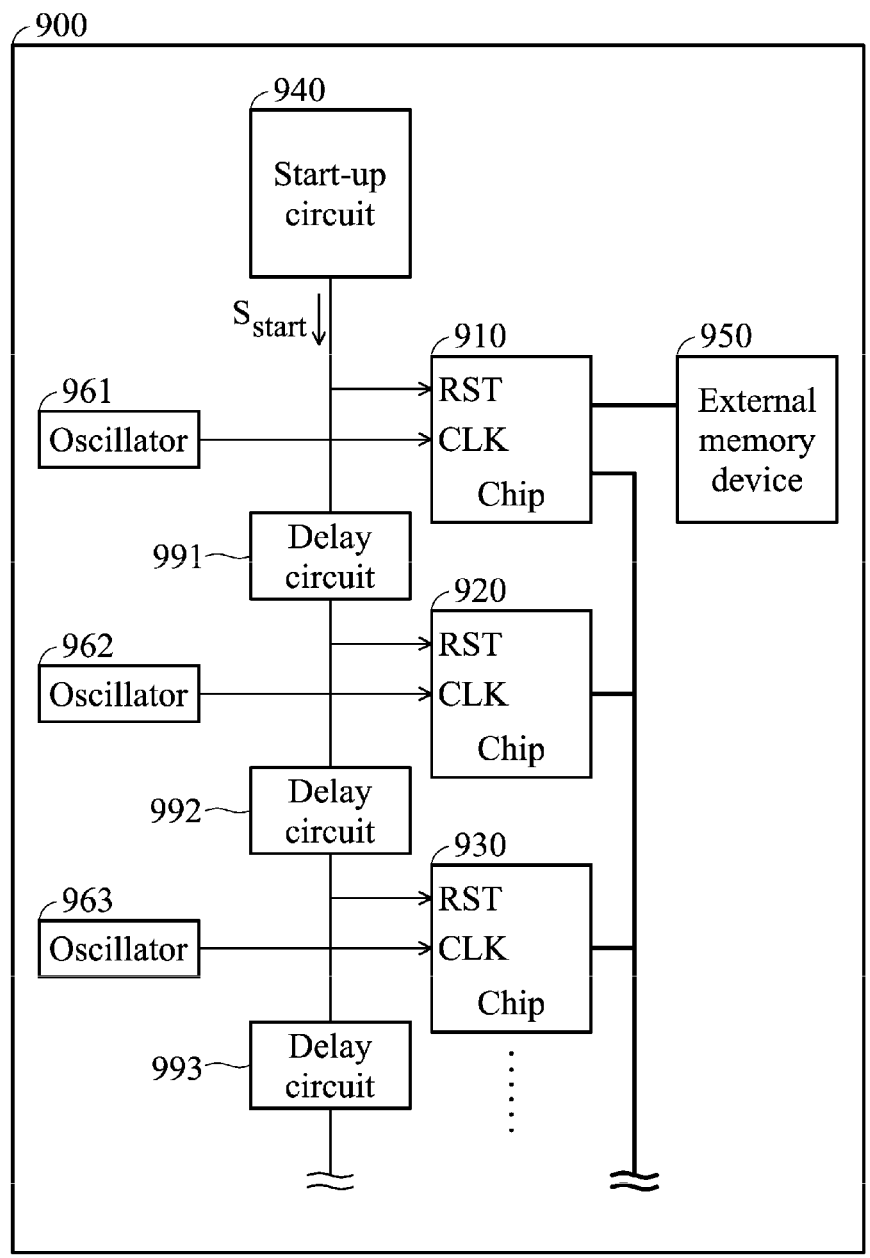
FIG. 9 shows a schematic block diagram of a hub device according to still another embodiment of the invention.

FIG. 9 shows a schematic block diagram of a hub device according to still another embodiment of the invention. The hub device 900 may comprise chips 910, 920 and 930, a start-up circuit 940, oscillators 961, 962 and 963, delay circuits 991, 992 and 993 and an external memory device 950 disposed outside of the chips 910, 920 and 930. According to an embodiment of the invention, the chips 910, 920 and 930 may be sequentially enabled and may sequentially load the corresponding firmware data to finish the initialization procedure.

Note that most of the elements in FIG. 9 are the same as FIG. 5. The main difference therebetween is that the chip 920 obtains the corresponding firmware data from the upper tier chip 910 instead of the external memory device 950 in FIG. 9. In addition, the chip 930 also obtains the corresponding firmware data from the upper tier chip (such as 910 or 920) instead of the external memory device 950. Therefore, for descriptions of like elements, reference may be made to FIG. 4, FIG. 5 and FIG. 8, and are omitted here for brevity.

Figure 10:
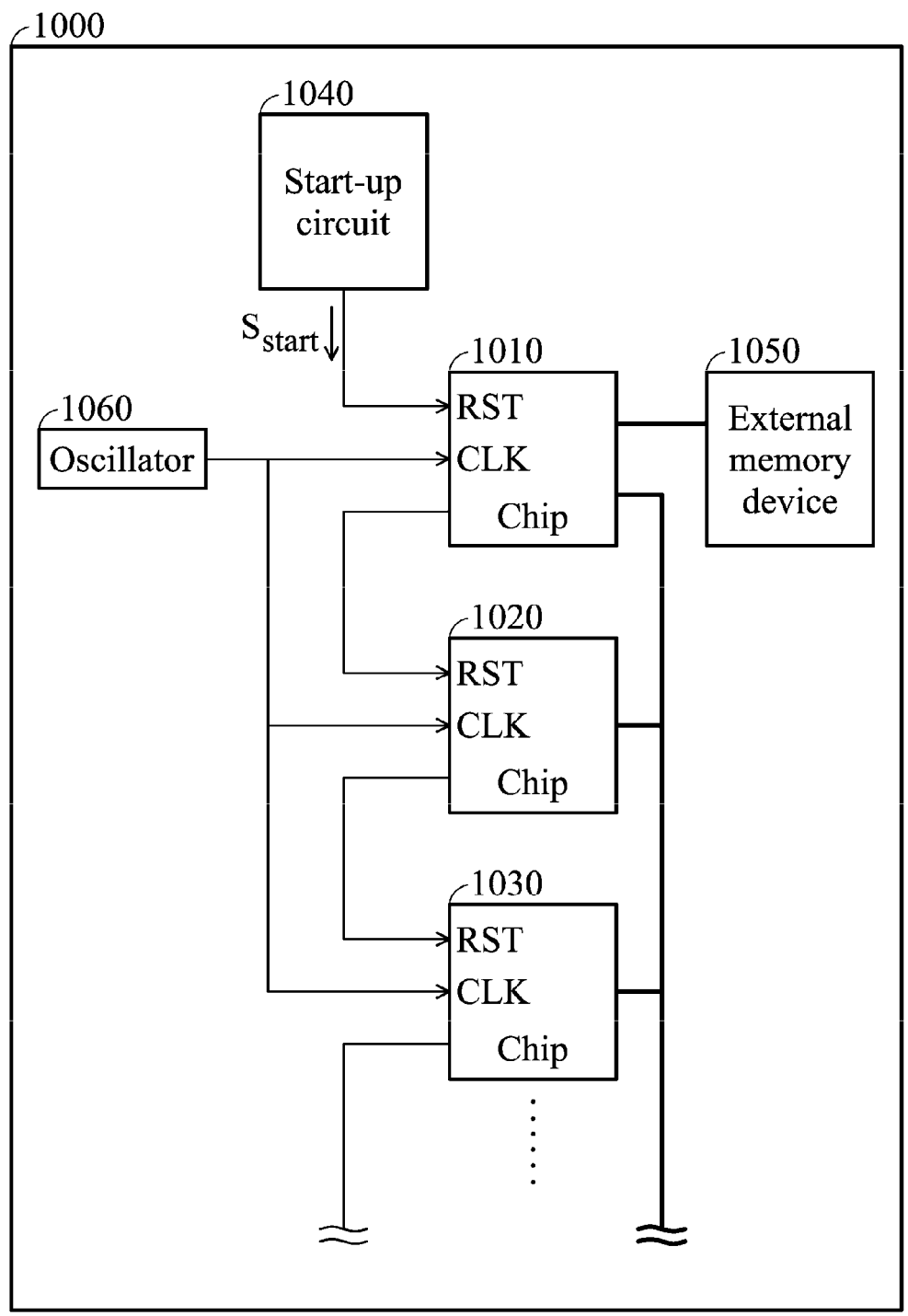
FIG. 10 shows a schematic block diagram of a hub device according to still another embodiment of the invention.

FIG. 10 shows a schematic block diagram of a hub device according to still another embodiment of the invention. The hub device 1000 may comprise chips 1010, 1020 and 1030, a start-up circuit 1040, an oscillator 1060 and an external memory device 1050 disposed outside of the chips 1010, 1020 and 1030. According to an embodiment of the invention, the chips 1010, 1020 and 1030 may be sequentially enabled and may sequentially load the corresponding firmware data to finish the initialization procedure.

Note that most of the elements in FIG. 10 are the same as FIG. 8. The main difference therebetween is that the chips 1010, 1020 and 1030 share the clock signal generated by the same oscillator 1060 in FIG. 10. Therefore, for descriptions of like elements, reference may be made to FIG. 4 and FIG. 8, and are omitted here for brevity.

Figure 11:
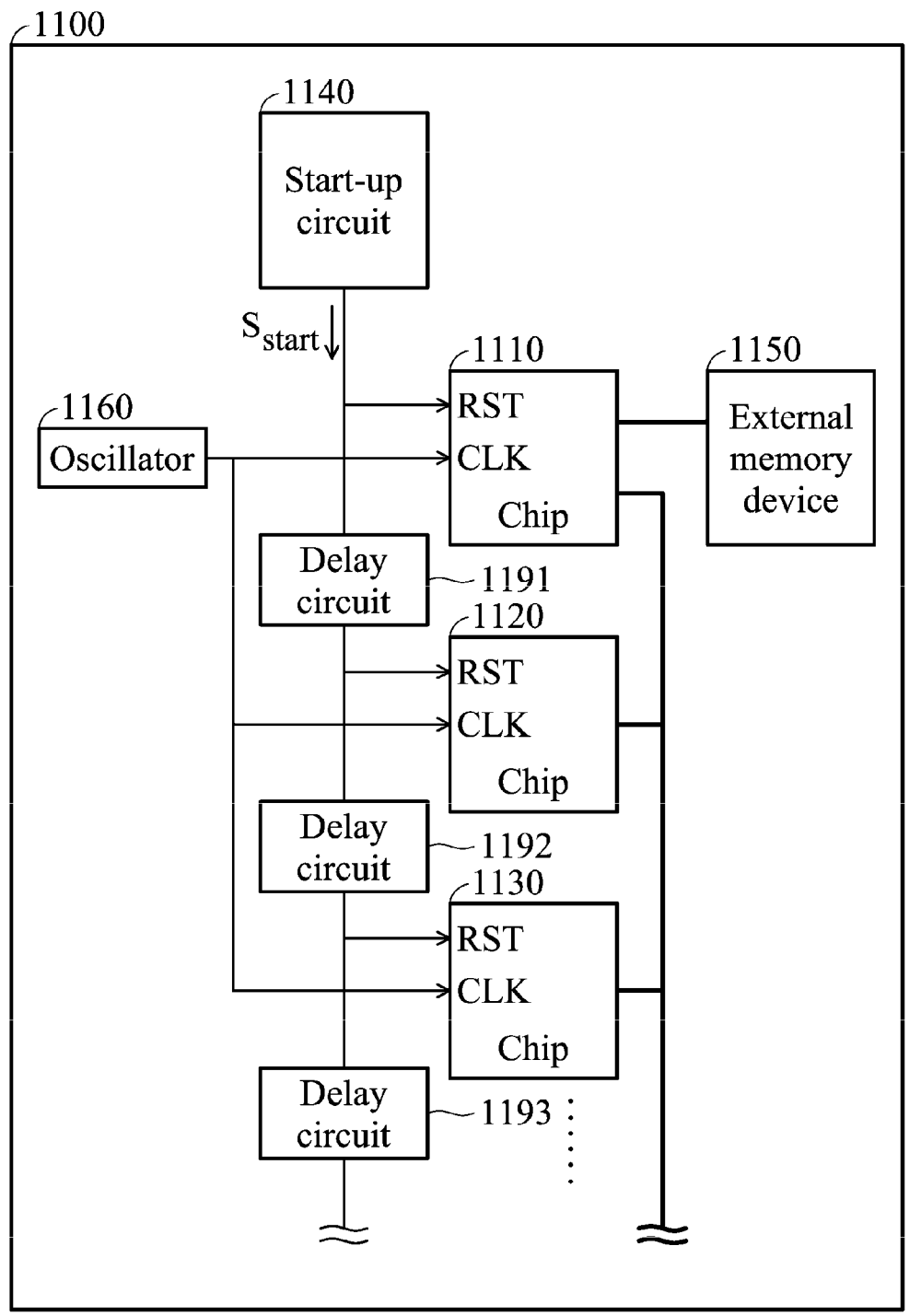
FIG. 11 shows a schematic block diagram of a hub device according to still another embodiment of the invention.

FIG. 11 shows a schematic block diagram of a hub device according to still another embodiment of the invention. The hub device 1100 may comprise at least chips 1110, 1120 and 1130, a start-up circuit 1140, an oscillator 1160, delay circuits 1191, 1192 and 1193 and an external memory device 1150 disposed outside of the chips 1110, 1120 and 1130. According to an embodiment of the invention, the chips 1110, 1120 and 1130 may be sequentially enabled and may sequentially load the corresponding firmware data to finish the initialization procedure.

Note that most of the elements in FIG. 11 are the same as FIG. 9. The main difference therebetween is that the chips 1110, 1120 and 1130 share the clock signal generated by the same oscillator 1160 in FIG. 11. Therefore, for descriptions of like elements, reference may be made to FIG. 4, FIG. 5, FIG. 8 and FIG. 9, and are omitted here for brevity.

As discussed above, according to the embodiments of the invention, the control signals received by the chips in the hub device can be sequentially generated for sequentially enabling each chip and collision (that is, when two or more chips access the shared external memory device at the same time) can be prevented. Several embodiments of sequentially enabling the chips are further illustrated in the following paragraphs.

Figure 12:
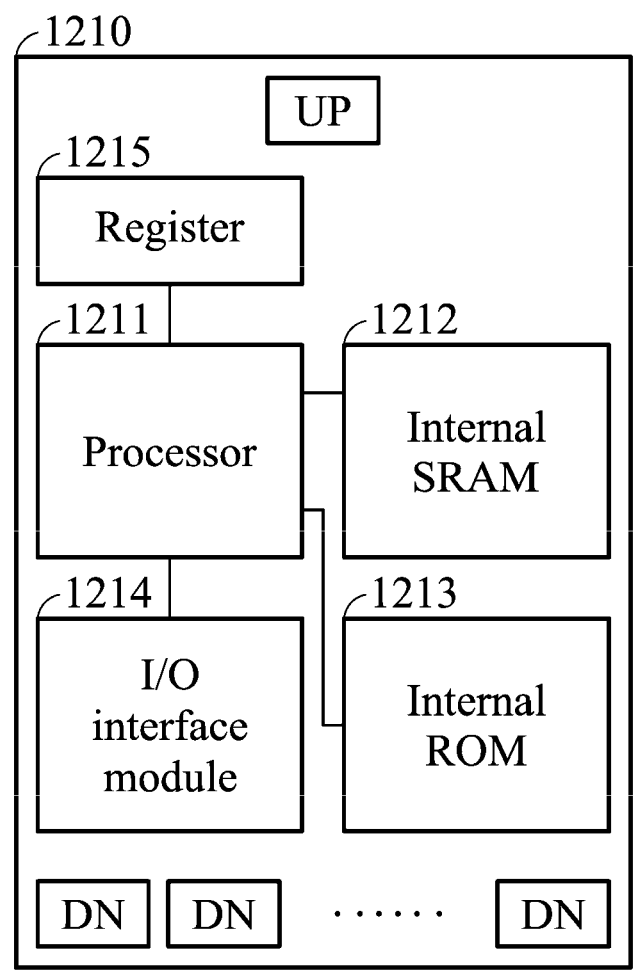
FIG. 12 shows a block diagram of a chip according to an embodiment of the invention.

FIG. 12 shows a block diagram of a chip according to an embodiment of the invention. According to an embodiment of the invention, the chip 1210 may be any tier of chip in the hub device, and may comprise at least an upstream port UP, a plurality of downstream ports DN, a processor 1211, an internal statistic random access memory (SRAM) 1212, an internal read only memory (ROM) 1213, an input/output (I/O) interface module 1214 and a register 1215. The processor 1211 may be arranged to execute the software and firmware programs stored in the internal SRAM 1212 or internal ROM 1213 for maintaining the operations of the chip. Accompanied with the block as shown in FIG. 12, several embodiments of the chips being sequentially enabled are illustrated in the following paragraphs.

Figure 13:
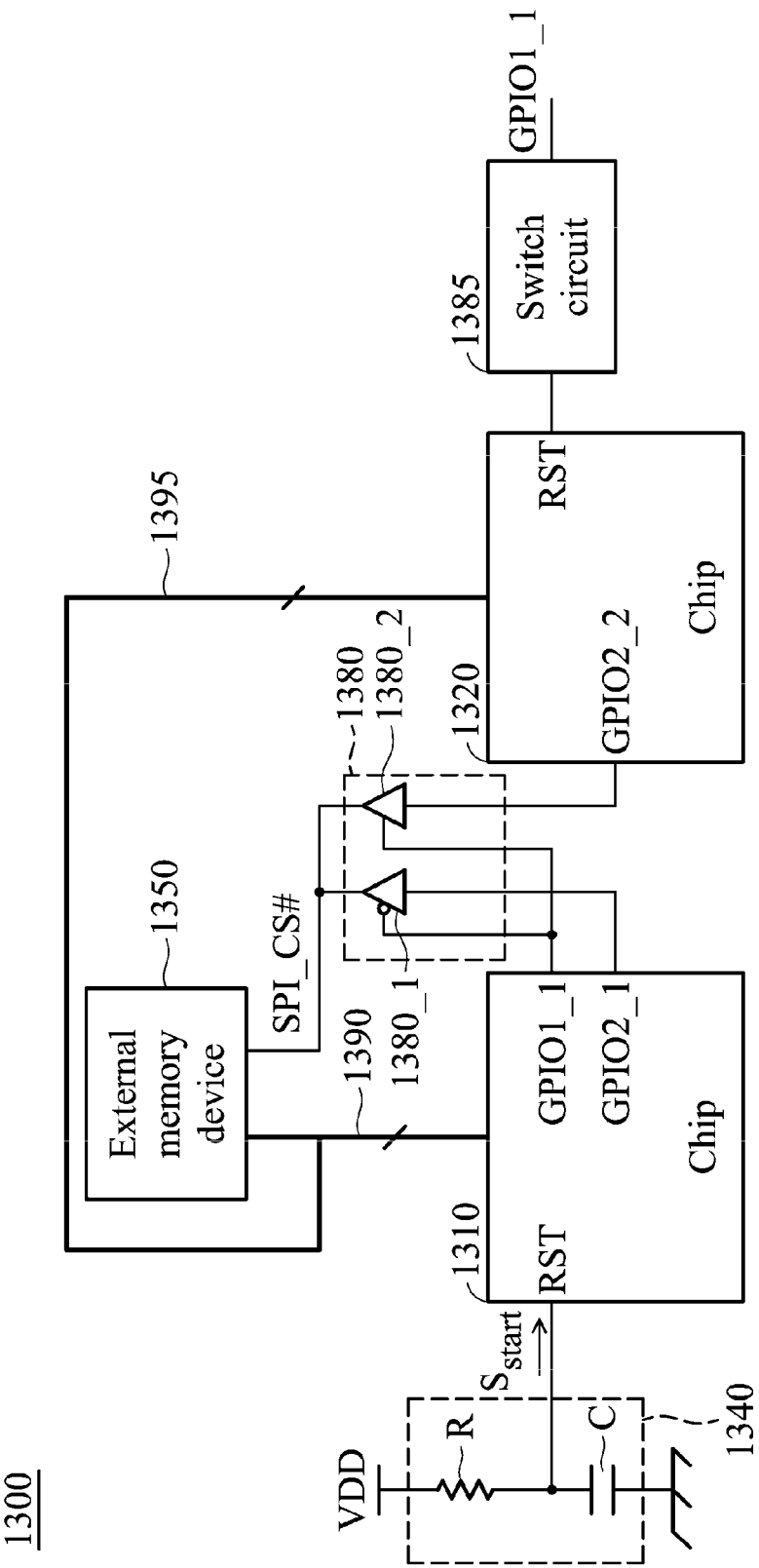
FIG. 13 shows a schematic block diagram of a hub device according to still another embodiment of the invention.

FIG. 13 shows a schematic block diagram of a hub device according to still another embodiment of the invention. The hub device 1300 may comprise at least chips 1310 and 1320, a start-up circuit 1340, switch circuits 1380 and 1385 and an external memory device 1350 disposed outside of the chips 1310 and 1320. According to an embodiment of the invention, the chips 1310 and 1320 may be sequentially enabled and may sequentially load the corresponding firmware data from the external memory device 1350 to finish the initialization procedure. In the embodiment, the external memory device 1350 may be coupled to the chips 1310 and 1320 via the SPI bus, and coupled to the I/O interface module of the chips 1310 and 1320 via the SPI bus. In an embodiment of the invention, the pin SPI_CS# of the SPI bus as discussed above is coupled to a General Purpose Input/Output (GPIO) pin of the I/O interface module of the chips 1310 and 1320. The chip 1310 may control the switch circuit 1380 so as to selectively conduct the transmission path between the GPIO pin of the chip 1310 and the pin SPI_CS# of the SPI bus, or conduct the transmission path between the GPIO pin of the chip 1320 and the pin SPI_CS# of the SPI bus. Thereby, the chip 1310 or 1320 may obtain the control right of accessing the external memory device 1350.

The start-up circuit 1340 may be coupled to a voltage input terminal VDD and the chip 1310, and may comprise a resistor R and a capacitor C coupled in serial. When the hub device 1300 is powered by an electric power source, the start-up circuit 1340 may generate the start-up signal $S_{Start}$ based on the voltage at the voltage input terminal VDD, and may transmit the start-up signal $S_{Start}$ to a reset signal input terminal RST of the chip 1310, to enable/reset the chip 1310. During the initialization procedure of the chip 1310, the processor may set the voltage levels at the GPIO pin GPIO1_1 and GPIO2_1 to a first predetermined level (for example, a low voltage level). Switching of the switch circuit 1380 is controlled by setting the voltage level at the GPIO pin GPIO1_1 to the first predetermined level, so as to conduct the transmission path between the GPIO pin GPIO2_1 and the pin SPI_CS#. In this manner, the chip 1310 may obtain the control right of accessing the external memory device 1350 after coupling the voltage level (the first predetermined level) at the GPIO pin GPIO2_1 to the pin SPI_CS#, and then the chip 1310 may access the firmware data required during the initialization procedure.

In FIG. 13, the switch circuit 1380 may comprise two complementary switches 1380_1 and 1380_2. For example, two Transistor-Transistor Logic (TTL) devices. The control terminal, input terminal and output terminal of the switch 1380_1 are respectively coupled to the pins GPIO1_1, GPIO2_1 and the pin SPI_CS#. The control terminal, input terminal and output terminal of the switch 1380_2 are respectively coupled to the pins GPIO1_1, GPIO2_2 and the pin SPI_CS#. Note that since the switches 1380_1 and 1380_2 are two complementary switches and the control terminals of the switches 1380_1 and 1380_2 are both coupled to the pin GPIO1_1, the pin SPI_CS# will not be coupled to both the voltage levels at the pin GPIO2_1 and the pin GPIO2_2 at the same time. Thus, simultaneous access of the external memory device 1350 by the chips 1310 and 1320 can be prevented.

When the chip 1310 obtains the control right of accessing the external memory device 1350, the chip 1310 may receive the corresponding firmware data from the external memory device 1350 via the SPI bus 1390 and then write or store the firmware data in the internal SRAM of the chip 1310. After initialization of the chip 1310 is completed, the processor of the chip 1310 may set the voltage level at the pin GPIO1_1 from the first predetermined level to a second predetermined level (for example, high voltage level). Switching of the switch circuit 1380 can be controlled by setting the voltage level at the pin GPIO1_1 to the second predetermined level, so as to turn off the transmission path between the pin GPIO2_1 of the chip 1310 and the pin SPI_CS#, and conduct the transmission path between the pin GPIO2_2 of the chip 1320 and the pin SPI_CS#.

In this manner, the chip 1310 may release the control right of accessing the external memory device 1350. As shown in FIG. 13, in addition to being coupled to the switch circuit 1380, the pin GPIO1_1 is further coupled to the switch circuit 1385. After releasing the control right of accessing the external memory device 1350, the switch circuit 1385 is conducted. A second start-up signal is generated and transmitted to the reset signal input terminal RST of the chip 1320 to enable/reset the chip 1320. During the initialization procedure of the chip 1320, the processor of the chip 1320 may set the voltage level at the GPIO pin GPIO2_2 to the first predetermined voltage level (for example, the low voltage level). Note that the chip 1310 already released the control right of accessing the external memory device 1350 when the chip 1320 was enabled/reset and the switch circuit 1380 already conducted the transmission path between the pin GPIO2_2 and the pin SPI_CS#. Therefore, the chip 1320 may obtain the control right of accessing the external memory device 1350 via the voltage level at the pin GPIO2_2 (that is, the first predetermined voltage). Next, the chip 1320 may receive the corresponding firmware data from the external memory device 1350 via the SPI bus 1395 and then write or store the firmware data in the internal SRAM of the chip 1320 to finish the initialization procedure. Note that in order to clarify the description of how the chips sequentially obtain the control right of accessing the external memory device 1350 via the SPI pin SPI_CS#, the SPI bus 1390 or the SPI bus 1395 in FIG. 13 does not comprise the SPI pin SPI_CS#. However, when implementing, the SPI bus 1390 or the SPI bus 1395 in FIG. 13 actually comprises the SPI pin SPI_CS#.

Note further that the invention is not limited to the methods of setting the voltage at the GPIO pin and the control logic of the switch circuit as discussed above. Any setting method and control logics that can achieve the same or similar results can all be applied in the embodiments of the invention.

Figure 14:
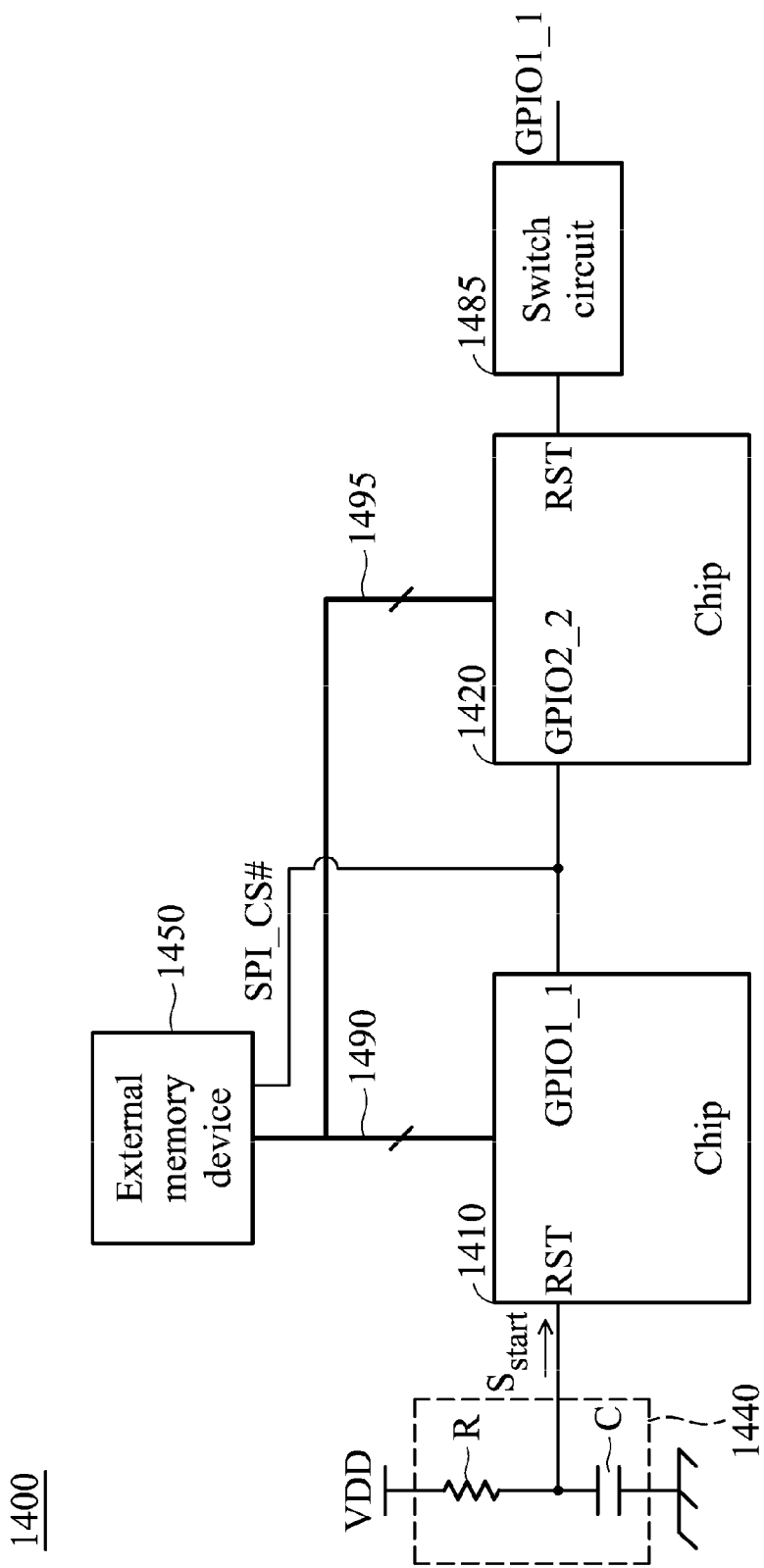
FIG. 14 shows a schematic block diagram of a hub device according to still another embodiment of the invention.

FIG. 14 shows a schematic block diagram of a hub device according to still another embodiment of the invention. The hub device 1400 may comprise at least chips 1410 and 1420, a start-up circuit 1440, switch circuit 1485 and an external memory device 1450 disposed outside of the chips 1410 and 1420. According to an embodiment of the invention, the chips 1410 and 1420 may be sequentially enabled and may sequentially load the corresponding firmware data to finish the initialization procedure. In the embodiment, the external memory device 1450 may be coupled to the chips 1410 and 1420 via the SPI bus, and the I/O interface module of the chips 1410 and 1420 may comprise a plurality of GPIO pins. For example, as shown in FIG. 14, the switch circuit 1485 is coupled between the pin GPIO1_1 of a plurality of GPIO pins of chip 1410 and the reset signal input terminal RST of the chip 1420. The pin SPI_CS# of the external memory device 1450 is coupled to the pin GPIO1_1 of a plurality of GPIO pins of chip 1410 and the pin GPIO2_2 of a plurality of GPIO pins of chip 1420.

In the embodiment, the timing of enabling/resetting the chip 1420 is controlled by the chip 1410.

When the chip 1410 is enabled or reset in response to the start-up signal $S_{Start}$ generated by the start-up circuit 1440, the processor of the chip 1410 may set the voltage level at the pin GPIO1_1 to the first predetermined level (for example, a low voltage level) as discussed above to obtain the control right of accessing the external memory device 1450, and may read the required firmware data from the external memory device 1450 via the SPI bus 1490 and write or store the firmware data into the internal SRAM of the chip 1410. Meanwhile, since the voltage level at the pin GPIO1_1 is at the first predetermined level (for example, a low voltage level), the switch circuit 1485 will not be conducted to enable/reset the chip 1420. When the chip 1410 has finished the initialization procedure or has finished reading the required firmware data from the external memory device 1450, the processor of the chip 1410 may set the voltage level of the pin GPIO1_1 to the second predetermined level (for example, a high voltage level) as discussed above to release the control right of accessing the SPI bus. Meanwhile, since the voltage level at the pin GPIO1_1 changes (for example, from the low voltage level to the high voltage level), the switch circuit 1485 may switch to enable or reset the chip 1420.

After leaving the enable/reset state of the chip 1420, the processor of the chip 1420 may further set the voltage level of the pin GPIO2_2 to the first predetermined level (for example, a low voltage level) as discussed above to obtain the control right of accessing the external memory device 1450 and access the required firmware data from the external memory device 1450 via the SPI bus 1495 and then write or store the firmware data into the internal SRAM of the chip 1420 to finish the initialization procedure. Note that before the chip 1420 obtains the control right of accessing the external memory device 1450, the chip 1410 has already released the control right of accessing the external memory device 1450.

Figure 15:
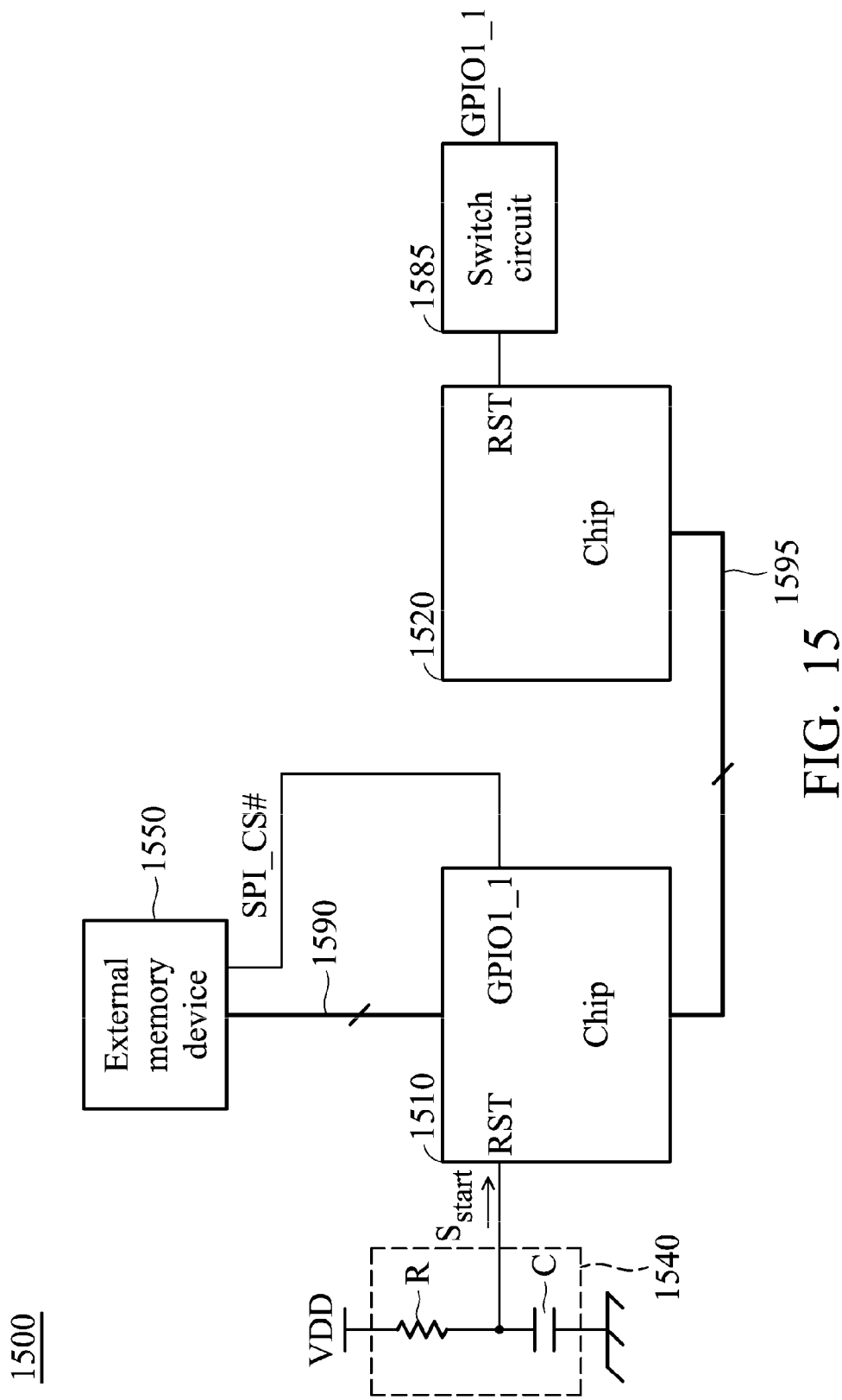
FIG. 15 shows a schematic block diagram of a hub device according to still another embodiment of the invention.

FIG. 15 shows a schematic block diagram of a hub device according to still another embodiment of the invention. The hub device 1500 may comprise at least chips 1510 and 1520, a start-up circuit 1540, switch circuits 1585 and an external memory device 1550 disposed outside of the chips 1510 and 1520. According to an embodiment of the invention, the chips 1510 and 1520 may be sequentially enabled and sequentially load the corresponding firmware data to finish the initialization procedure. In the embodiment, the external memory device 1550 may be coupled to the chip 1510 via the SPI bus 1590. The chip 1510 may be coupled to the chip 1520 via the SPI bus 1595. The I/O interface module of the chips 1510 and 1520 may comprise a plurality of GPIO pins. As shown in FIG. 15, the switch circuit 1585 is disposed between the pin GPIO1_1 of the plurality of GPIO pins of the chip 1510 and reset the signal input terminal RST of the chip 1520. The pin SPI_CS# of the external memory device 1550 may also be coupled to the pin GPIO1_1 of the chip 1510.

In the embodiment, the enable/reset timing of the chip 1520 may be controlled by the chip 1510.

When the chip 1510 is enabled or reset in response to the start-up signal $S_{Start}$ generated by the start-up circuit 1540, the processor of the chip 1510 may set the voltage level of the pin GPIO1_1 to the first predetermined level (for example, a low voltage level) as discussed above to obtain the control right of accessing the external memory device 1550, and may read the required firmware data from the external memory device 1550 via the SPI bus 1590. Note that different from FIG. 14, in the embodiment, the chip 1510 may further read the firmware data of the chip 1520 during the initialization procedure. Meanwhile, since the voltage at the pin GPIO1_1 is set to the first predetermined level (for example, the low voltage level), the switch circuit 1585 is not conducted to enable/reset the chip 1520.

When the chip 1510 has finished the initialization procedure, the processor of the chip 1510 may set the voltage level at the pin GPIO1_1 to the second predetermined level (for example, the high voltage level) to release the control right of accessing the SPI interface as discussed above. Meanwhile, since the voltage level at the pin GPIO1_1 changes (for example, from low voltage level to high voltage level), the switch circuit 1585 may switch to enable or reset the chip 1520.

After leaving the enable/reset state of the chip 1520, the processor of the chip 1510 may transmit the corresponding firmware data required by the chip 1520 in the initialization procedure to the chip 1520 via the bus 1595 between the chips 1510 and 1520. Next, the chip 1520 may store the received firmware data in the internal SRAM to finish the initialization procedure. In addition, the chip 1510 may further set the internal register of the chip 1520 via the bus 1595 so as to enable the chip 1520 to directly execute the programs stored in the internal SRAM thereof. Note that in the embodiment of the invention, after the chip 1520 is enabled, the chip 1520 can directly execute the programs stored in the internal SRAM instead of obtaining the programs stored in the external memory device 1550 via the pin SPI_CS# of the external memory device 1550. Therefore, the GPIO pin (for example, the pin GPIO2_2 of the plurality of GPIO pins in the above embodiments) in the I/O interface module of the chip 1520 is not coupled to the pin SPI_CS# of the external memory device 1550.

In an embodiment of the invention, the bus 1595 between the chips 1510 and 1520 may be the SM bus, I2C bus or SPI bus. The SM bus, I2C bus or SPI bus may be implemented by the plurality of GPIO pins in the I/O interface module in the chips 1510 and 1520. In addition, as discussed above, the chip 1510 may actively transmit the firmware data of the chip 1520 to the chip 1520, or the chip 1510 may issue a request signal to the chip 1510 and then the chip 1510 may transmit the firmware data of the chip 1520 to the chip 1520 in response to the request signal. Therefore, the invention should not be limited to either way of implementation.

Figure 16:
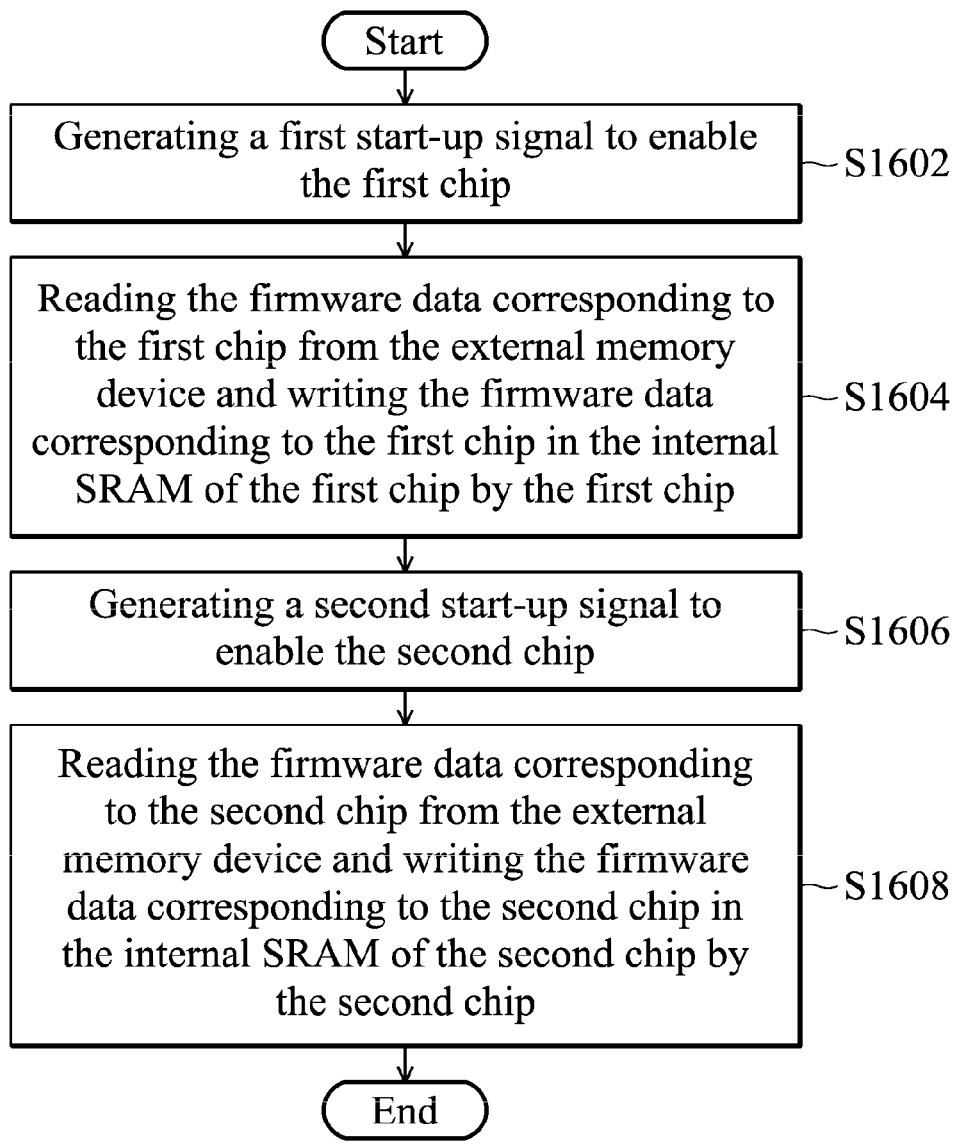
FIG. 16 shows a flow chart of a method for initializing a hub device according to an embodiment of the invention.

FIG. 16 shows a flow chart of a method for initializing a hub device according to an embodiment of the invention. Note that for simplicity, in the embodiment, the hub device comprises two chips and an external memory device shared by the two chips. First of all, a first start-up signal is generated to enable the first chip (step S1602). As discussed above, the first start-up signal may be generated by the start-up circuit. Next, the first chip reads the firmware data corresponding to the first chip from the external memory device (step S1604). In an embodiment, the first chip may write the firmware data corresponding to the first chip into the internal SRAM of the first chip. Next, a second start-up signal is generated to enable the second chip (step S1606). As discussed above, the second start-up signal may be generated by other circuits (for example, other start-up circuit or delay circuit) or by the first chip. Note that steps S1604 and S1606 may be simultaneously executed. Finally, after the first chip has finished reading the external memory device or releases the control right of accessing the external memory device, the second chip reads the firmware data corresponding to the second chip from the external memory device (Step S1608). In an embodiment, the second may write the firmware data corresponding to the second chip into the internal SRAM of the second chip.

Figure 17:
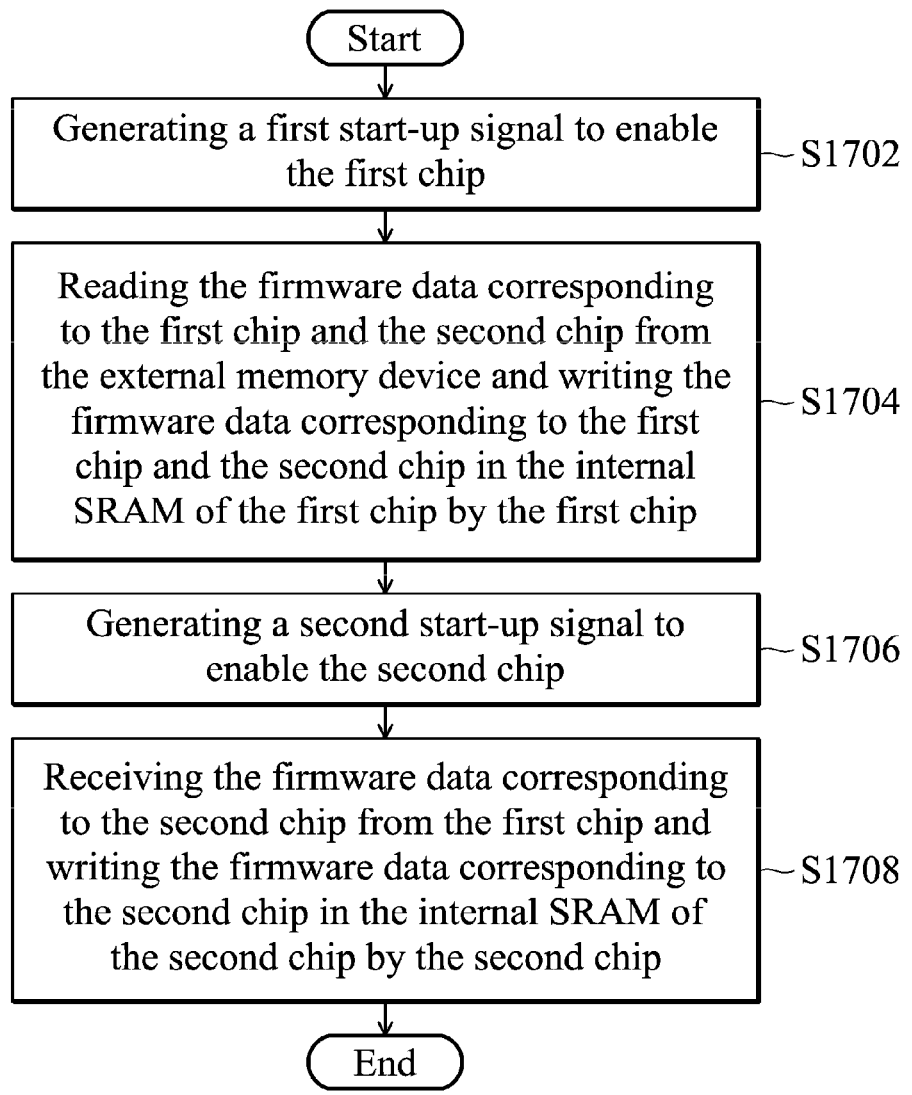
FIG. 17 shows another flow chart of a method for initializing a hub device according to another embodiment of the invention.

FIG. 17 shows another flow chart of a method for initializing a hub device according to another embodiment of the invention. Note that for simplicity, in the embodiment, the hub device comprises two chips and an external memory device shared by the two chips. First of all, a first start-up signal is generated to enable the first chip (step S1702). As discussed above, the first start-up signal may be generated by the start-up circuit. Next, the first chip reads the firmware data corresponding to the first chip and the second chip from the external memory device. In an embodiment, the firmware data corresponding to the first chip and the second chip is written to the internal SRAM of the first chip (step S1704). Next, a second start-up signal is generated to enable the second chip (step S1706). As discussed above, the second start-up signal may be generated by other circuits (for example, other start-up circuit or delay circuit) or by the first chip. In addition, steps S1704 and S1706 may be simultaneously executed. Finally, the second chip receives the firmware data corresponding to the second chip from the first chip, and writes the firmware data corresponding to the second chip to the internal SRAM of the second chip (Step S1708). As discussed above, the first chip may transmit the firmware data corresponding to the second chip to the second chip actively or in response to a request signal.

Operations of the hub devices are illustrated above via the schematic block diagrams and the flow charts referenced. In some embodiments, for the operations of the chips, each chip has to determine whether the external memory device exists, so as to determine whether to load the firmware data from the external memory device. In addition, since each tier of chip may have different operations, in some embodiments of the invention, the chip has to determine which tier of chip in the tired hub device it belongs to. For example, the way to handle the over current condition for different tiers of chips may be different. In addition, in some embodiments where the first tier of chip is used to enable/reset the other tiers of chips and/or where only the first tier of chip is used to access the external memory device, each chip may also have to determine whether it is the first tier chip or not. If so, the first tier chip has to generate the corresponding signals to enable/reset other tiers of chips, access the corresponding firmware data for the other tiers of chips, and/or set the registers of the other tiers of chips, and so on. If not, the other tiers of chips may wait for the firmware data transmitted by the first tier chip, or actively transmit a request signal to the first tier chip.

According to some embodiments of the invention, each chip may determine which tier in the tiered hub device it belongs to based on voltage level of GPIO pins. The voltage levels at the GPIO pins may be set when manufacturing the hub device. According to some other embodiments of the invention, each chip may also determine which tier in the tiered hub device it belongs to based on the data stored in the internal ROM. Generally, the internal ROM may store some programs to maintain the basic function of the chips. For example, the boot sequence or other programs, and some important information, such as the information regarding the address for accessing the external memory device.

Figure 18:
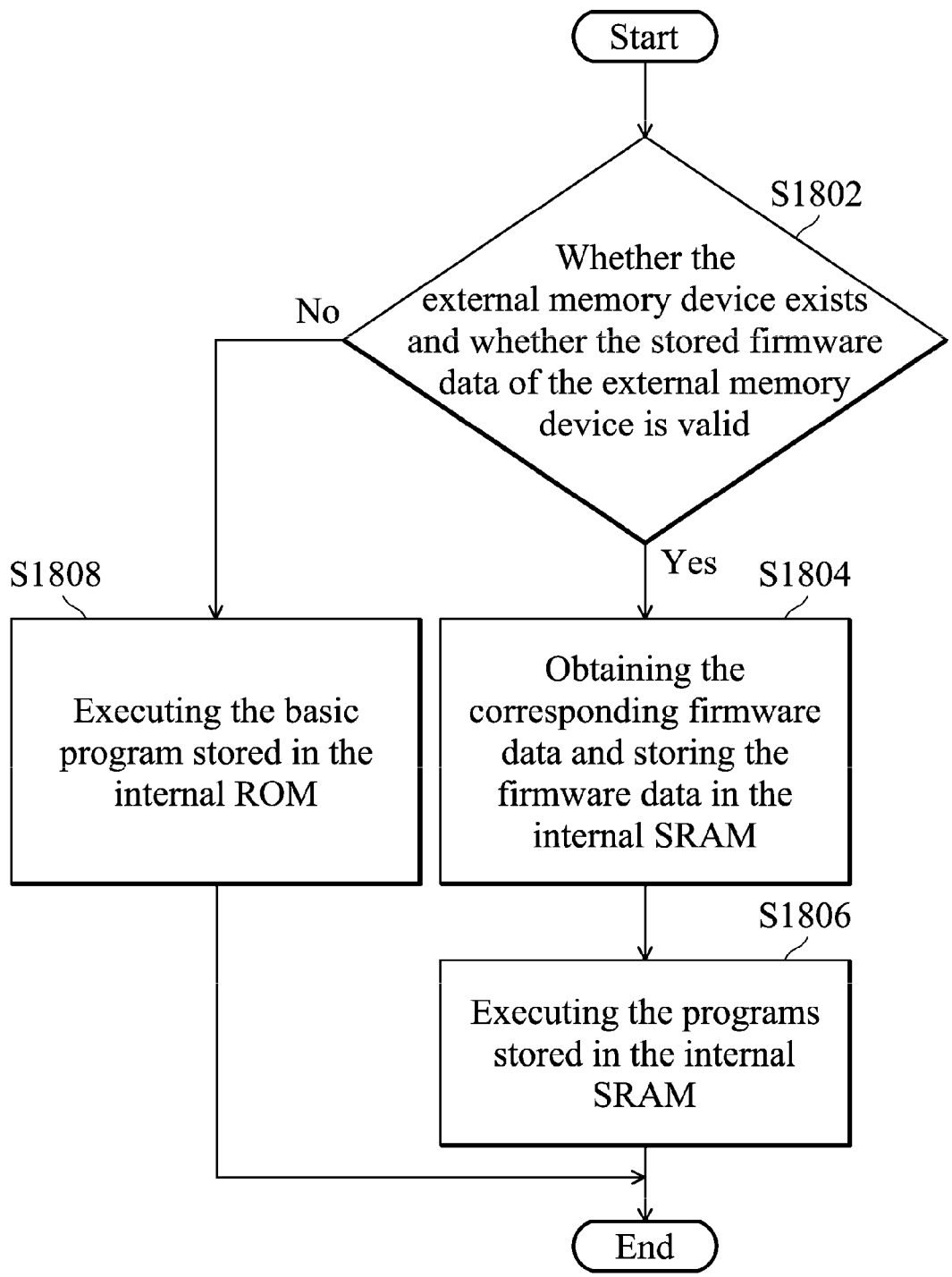
FIG. 18 shows a flow chart of a method for starting-up a chip based on a start-up program according to an embodiment of the invention.

FIG. 18 shows a flow chart of a method for starting-up a chip based on a start-up program according to an embodiment of the invention. When the chip is enabled or reset, the chip may further determine to firstly execute the program stored in the memory device based on the setting values of the register. Generally, the register may be set in advance such that the chip may execute the power on procedure stored in the internal ROM. Therefore, the processor may execute the boot sequence first. Based on the boot sequence, the processor may first determine whether the external memory device exists and whether the stored firmware data of the external memory device is valid (step S1802). For example, if the external memory device exists, the processor may read the content in the header of the external memory device so as to obtain the information regarding the address and data size of the firmware data, and determine whether the firmware data are valid based on the information.

When the firmware data stored in the external memory device is valid, the processor starts to access the external memory device to obtain the corresponding firmware data. In some embodiment, the processor stores the obtained firmware data in the internal SRAM (Step S1804), and then the processor may execute the programs stored in the internal SRAM (Step S1806) and operate according to the programs. For example, the processor may next trigger a software reboot procedure so as to reboot the chip from the internal SRAM and execute the programs stored in the internal SRAM. For another example, after loading the firmware data, the processor may further change to execute the programs stored in the internal SRAM by changing the setting values of the register.

When the external memory device does not exist, or the external memory device exists but the firmware data is invalid, the processor may directly execute the basic program stored in the internal ROM (Step S1808) and operate according to the programs.

The above-described embodiments of the present invention can be implemented in any of numerous ways. For example, the embodiments may be implemented using hardware, software or a combination thereof. It should be appreciated that any component or collection of components that perform the functions described above can be generically considered as one or more processors that control the above discussed function. The one or more processors can be implemented in numerous ways, such as with dedicated hardware, or with general purpose hardware that is programmed using microcode or software to perform the functions recited above.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A hub device, comprising:
a first chip, comprising at least a first upstream port and a plurality of first downstream ports;
a second chip, comprising at least a second upstream port and at least one second downstream port;
an external memory device, storing firmware data corresponding to the first chip and the second chip; and
a switch circuit, coupled between an input/output pin of the first chip and a reset signal input terminal of the second chip, wherein one of the first downstream ports of the first chip is coupled to the second upstream port of the second chip to form a tiered hub, and the first chip and the second chip are sequentially enabled and the first chip and the second chip sequentially load the corresponding firmware data, and wherein the first chip is enabled in response to a first start-up signal to read the firmware data corresponding to the first chip and the second chip from the external memory device and store the firmware data corresponding to the first chip and the second chip in an internal static random access memory of the first chip, and wherein the second chip is enabled in response to a second start-up signal to receive the firmware data corresponding to the second chip from the first chip.

2. The hub device as claimed in claim 1, further comprising:

a start-up circuit, for generating the first start-up signal to the first chip, wherein the first chip is enabled in response to the first start-up signal to read the firmware data corresponding to the first chip and the second chip from the external memory device, and then to generate the second start-up signal to the second chip.

3. The hub device as claimed in claim 1, further comprising:

a start-up circuit, for generating the first start-up signal to the first chip; and a delay circuit, for delaying the first start-up signal to generate the second start-up signal to the second chip after a predetermined time interval.

4. The hub device as claimed in claim 1, wherein the first chip and the second chip further comprises:

a processor;
the internal static random access memory; and
an input/output interface module.

5. The hub device as claimed in claim 4, further comprising:

a start-up circuit, for generating the first start-up signal to the first chip, wherein the first chip is enabled in response to the first start-up signal for reading the firmware data corresponding to the first chip and the second chip from the external memory device and then storing the firmware data corresponding to the first chip and the second chip in the internal static random access memory of the first chip, and then the processor of the first chip further generates the second start-up signal and transmits the second start-up signal to the second chip via the input/output interface module of the first chip so as to enable the second chip.

6. The hub device as claimed in claim 5, wherein the first chip reads the firmware data corresponding to the first chip and the second chip from the external memory device via the input/output interface module of the first chip and a first SPI bus or a first I2C bus, and the second chip receives the firmware data corresponding to the second chip from the first chip via a second SPI bus, a second I2C bus or a System Management (SM) bus in the input/output interface module of the second chip.

7. The hub device as claimed in claim 1, further comprising:

an oscillator, generating a clock signal, and being shared by the first chip and the second chip.

8. A method for initializing a hub device, wherein the hub device comprises at least a first chip and a second chip, and an external memory device, the external memory device being shared by the first chip and the second chip and storing firmware data of the first chip and the second chip, the method comprising:

generating a first start-up signal to enable the first chip;
reading the firmware data corresponding to the first chip and the second chip from the external memory device by the first chip;
storing the firmware data corresponding to the first chip and the second chip in an internal static random access memory of the first chip by the first chip;
providing a signal via a switch circuit coupled between an input/output pin of the first chip and a reset input terminal of the second chip;
generating a second start-up signal to enable the second chip; and
receiving the firmware data corresponding to the second chip from the first chip by the second chip.

9. The method as claimed in claim 8, further comprising:
issuing a request signal by the second chip to the first chip for requesting the first chip to transmit the firmware data corresponding to the second chip to the second chip.

10. The method as claimed in claim 8, wherein the second start-up signal is generated by the first chip.

11. The method as claimed in claim 8, wherein the second start-up signal is generated by a delay circuit based on the first start-up signal after receiving the first start-up signal and waiting for a predetermined time interval, wherein the predetermined time interval is longer than a time interval required for reading the firmware data corresponding to the first chip and the second chip.

12. The method as claimed in claim 8, wherein when the first chip is enabled, the method further comprises:
determining whether the external memory device exists and whether the stored firmware data of the external memory device is valid.

13. The method as claimed in claim 8, further comprising:
generating a clock signal by an oscillator shared by the first chip and the second chip.

* * * * *